United States Patent [19]
Tzukerman et al.

[11] Patent Number: 5,438,590
[45] Date of Patent: Aug. 1, 1995

[54] TRANSMITTING AND RECEIVING APPARATUS AND METHOD INCLUDING PUNCTURED CONVOLUTIONAL ENCODING AND DECODING

[75] Inventors: Shimon Tzukerman, Israel, Israel; James N. Esserman, San Diego, Calif.

[73] Assignee: Comstream Corporation, San Diego, Calif.

[21] Appl. No.: 65,292

[22] Filed: May 24, 1993

[51] Int. Cl.$^6$ .................................. H04L 27/00
[52] U.S. Cl. ........................... 375/259; 375/340; 371/43
[58] Field of Search ............... 375/37, 94, 121, 17, 375/86; 371/43; 455/39, 56.1, 193.1

[56] References Cited

U.S. PATENT DOCUMENTS

| | | | |
|---|---|---|---|
| 5,029,331 | 7/1991 | Heichler et al. | 371/43 |
| 5,117,427 | 5/1992 | Miyake et al. | 371/37.4 |
| 5,233,630 | 8/1993 | Wolf | 375/67 |
| 5,295,142 | 3/1994 | Hatakeyama | 371/43 |

OTHER PUBLICATIONS

Yasuda et al, "Development of Variable-Rate Viterbi Decoder and Its Performance Characteristics," Sixth International Conference on Digital Satelite Communications, Phoenix, Ariz., Sep. 19–23, 1983.

Qualcomm, Incorporated, "Q1650, K=7 Multi–Code Rate Viterbi Decoder, 2.5, 10, 25 Mbps Data Rates", Technical Data Sheet.

*Primary Examiner*—Edward L. Coles, Sr.
*Assistant Examiner*—Madeleine Nguyen

*Attorney, Agent, or Firm*—Lowe, Price, LeBlanc & Becker

[57] ABSTRACT

Digital data are communicated from a transmitter to a terrestrial receiver by encoding the data into first and second ½ rate convolutional encoded signals during different periods. During the different periods, the convolutional signals are encoded into first and second forward error correction convolutional encoded signals having ⅞ and 6/7 punctured codes transmitted to the receiver via a satellite. Power emitted from the satellite during the first period is 3 db lower than that emitted during the second period. An antenna dish having a diameter no greater than about 1 meter is at the receiver responsive to both signals emitted from the satellite. The encoded signals include sequential bits $P_1(0)$, $P_1(1)$, etc. and $P_2(0)$, $P_2(1)$, etc. At the ⅞ rate, parallel punctured bit streams respectively including sequential bits $P_1(0)$, $P_2(1)$, $P_2(2)$, $P_1(4)$ and $P_2(0)$, $P_1(2)$, $P_2(3)$, $P_2(4)$ are derived. At the 6/7 rate, the punctured bit streams are respectively $P_1(0)$, $P_2(1)$, $P_1(3)$, $P_1(5)$, $P_2(6)$, $P_2(8)$, $P_2(10)$ and $P_2(0)$, $P_2(2)$, $P_2(4)$, $P_1(6)$, $P_2(7)$, $P_1(9)$, $P_1(11)$. Simultaneously derived bits of the parallel punctured bit streams simultaneously QPSK modulate a carrier. A punctured clock is combined with the serial signal to derive a pair of wavetrains G1 and G2 including the I and Q channel sequential bits and dummy bits inserted into the serial signal. The receiver responds to the QPSK carrier to derive a serial signal having sequential bits so channel I and Q sequential bits I(0), I(1), I(2) etc. and Q(0), Q(1), Q(2) etc. at the same time slots $t_k$, $t_{k+1}$, $t_{k+2}$ are sequentially derived as I(0), Q(0), I(1), Q(1), I(2), Q(2) etc.

47 Claims, 5 Drawing Sheets

TRANSMITTING AND RECEIVING APPARATUS AND METHOD INCLUDING PUNCTURED CONVOLUTIONAL ENCODING AND DECODING

FIELD OF THE INVENTION

The present invention relates generally to feed forward error correction transmitters, receivers, systems and methods employing punctured convolutional encoding and decoding and more particularly to such transmitters, receivers, systems and methods wherein (a) a serial bit stream at the transmitter and/or receiver is divided into a pair of bit streams and/or (b) feed forward error correction data signals having ⅔ and 6/7 punctured codes are radiated at mutually exclusive times from a geosynchronous satellite at first and second power levels, respectively, to a terrestrial receiving site including an antenna dish having a diameter of no more than approximately one meter.

BACKGROUND ART

In a convolutional encoded feed forward error correction transmitter, a binary bit stream is divided into first and second bit streams respectively including sequential bits $P_1(0)$, $P_1(1)$, $P_1(2)$, $P_1(3)$, $P_1(4)$ etc. and $P_2(0)$, $P_2(1)$, $P_2(2)$, $P_2(3)$, $P_2(4)$ etc. In one-half rate convolutional encoding, the first and second bit streams are formed by combining adjacent bits in the original bit stream in accordance with a modulo 2 function, i.e., by using half adders responsive to the adjacent bits.

Because of the redundancy in the first and second bit streams, it is possible to remove some of the bits from these bit streams without substantial loss of information; such removal of bits from the first and second bit streams is generally referred to in the art as puncturing. Optimum puncturing codes for these bit streams are disclosed by Yasuda et al., "Development of Variable-Rate Viterbi Decoder and its Performance Characteristics," 6th International Conference on Digital Satellite Communications, Phoenix, Arizona, September 1983. Yasuda et al. discloses optimal puncturing rates from ⅔ to 16/17. The ⅔ puncturing code or rate is represented by:

TABLE I

| 1 0 |
|---|
| 1 1 |

Lines 1 and 2 of Table I respectively indicate puncturing operations performed on the bits of the first and second bit streams. The first place in line 1 indicates the puncturing operations to be performed on bits $P_1(0)$, $P_1(2)$, $P_1(4)$ etc. of the first bit stream; the second place in line 1 indicates puncturing operations performed on bits $P_1(1)$, $P_1(3)$, $P_1(5)$ etc. of the first bit stream; the first place in line 2 of Table I indicates the puncturing operations performed on bits $P_2(0)$, $P_2(2)$, $P_2(4)$ etc. of the second bit stream; the second place in line 2 indicates the operations on bits $P_2(1)$, $P_2(3)$, $P_2(5)$ etc. Values of 1 and 0 in Table I respectively indicate there is no puncturing and there is puncturing. The puncturing code of Table I is applied to the first and second bit streams to provide punctured bit streams:

TABLE II

| $P_1 = P_1(0), P_1(2), P_1(4), P_1(6), P_1(8)$ etc. |
|---|
| $P_2 = P_2(0), P_2(1), P_2(4), P_2(3), P_2(4),$ etc. |

Thus bits $P_1(1)$, $P_1(3)$, $P_1(5)$, $P_1(7)$ etc. have been removed, i.e., punctured from the second bit stream. Yasuda et al. indicates the bit streams of Table II can be combined into a single serial bit stream by using a first in first out (FIFO) register such that the output of the first in first out register is:

TABLE III

| $P_1(0), P_2(0), P_2(1), P_1(2), P_2(2), P_2(3), P_1(4),$ $P_2(4), P_2(5), P_1(6), P_2(6), P_2(7), P_1(8)$ etc. |
|---|

The thus formed serial bit stream is applied to a modulator. Presumably, the serial bit stream applied to the modulator is a replica of the output of the FIFO, causing the modulator to emit a dual frequency shift key or bi-phase shift key signal. However, most satellite communications systems for binary data use a pair of orthogonal channels, generally referred to in the art as I and Q channels. Yasuda et al. is completely silent as to how the serial signal derived by the FIFO register can be divided into I and Q channels. Further, Yasuda et al. fails to disclose any receiving apparatus for the punctured convolutional encoded signal.

We are aware of a prior art two channel (I and Q) system employing punctured convolutional feed forward error correction techniques for handling only two specific punctured codes, viz: ¾ and ⅞. In this prior art system, the convolutional encoded signals are punctured directly, i.e., no serial bit stream is formed, as disclosed by Yasuda et al. Hence, this prior art two channel transmitter and receiver system is dedicated to only two punctured codes and cannot be used for all the optimum punctured rates or codes disclosed by Yasuda et al.

It is, accordingly, an object of the present invention to provide a new and improved two channel punctured convolutional encoded transmitter, receiver and transmission method capable of handling all of the optimum punctured codes.

In the near future, a system is to be introduced wherein digitally encoded intelligence signals (particularly television programs) are to be transmitted from a terrestrial site via a geosynchronous satellite to receiver sites having antenna dishes with diameters no greater than approximately one meter feeding home television receivers. Two systems are currently envisaged, respectively employing terrestrial receiving antenna dishes having diameters of approximately 60 and 90 centimeters.

When the system using the 60 centimeter dishes is initially employed and for some time thereafter, a rate ½ convolutional encoded signal having a ⅔ punctured code is to be radiated from the geosynchronous satellite at a power level of 10 watts to the receiver antennas. After the initial phase-in period, the radiated power is to be increased 3 db, to 20 watts. It was initially thought that a punctured code of ⅞ths could be used for the higher power level. As a result of bit error ratio analyses we have performed, we have realized that the ⅞ punctured code is not acceptable and the 6/7 punctured code must be used to achieve acceptable results at the higher power level.

It is, accordingly, another object of the invention to provide a new and improved feed forward error correction transmitting method and apparatus utilizing plural punctured codes and plural power levels.

Another object of the invention is to provide a new and improved punctured encoding method and apparatus particularly adapted for transmission of intelligence signals (particularly encoded television program signals) through a geosynchronous satellite to terrestrial ground sites having antenna reflecting dishes with diameters no greater than approximately one meter.

The Invention

In accordance with one aspect of the present invention, there is provided a new and improved method of communicating a digital data signal from a transmitter to a receiver during mutually exclusive transmitting periods. The digital data signal is encoded into a pair of ½ rate convolutional encoded signal during each of the periods. During the first transmission period, (1) the convolutional encoded signal is punctured to form a ⅔ code and (2) the encoded first forward error correction signal is transmitted to the receiver via a geosynchronous satellite. During the second transmission period, (1) the convolutional encoded signal is punctured to form a 6/7 code and (2) the encoded second forward error correction signal is transmitted to the receiver via the geosynchronous satellite. The power emitted from the satellite is controlled so the power emitted from the satellite of the encoded forward error correction signal having the ⅔ punctured code during the first period is appreciably lower than the power emitted from the satellite of the encoded forward error correction signal having the 6/7 punctured code during the second period. During both the first and second periods, the encoded forward error correction signals emitted from the satellite are received at the receiver with an antenna including a dish having a diameter no greater than about 1 meter. The received encoded forward error correction signals are decoded into a further signal that is an approximate replica of the digital data signal. This method is in contrast to the previously suggested ⅞ punctured encoding of the second forward error correction signal. We have found that the 6/7 punctured encoding is satisfactory for satellite emissions at the allotted 20 watts to antenna dishes under one meter, but that the ⅞ rate would not be satisfactory under these circumstances.

In one preferred embodiment, the digital data signal is a television program signal and the receiver site includes a conventional home television receiver.

Another aspect of the invention involves a receiver for digital data signals encoded into a pair of ½ rate convolutional encoded signals, wherein the ½ rate convolutional encoded signals are encoded at mutually exclusive times into first and second forward error correction convolutional coded data signals respectively having punctured codes of ⅔ and 6/7 and data in only one of the coded signals is coupled to the receiver at a time. The receiver comprises an antenna including a dish having a diameter no greater than about one meter. First circuit means responsive to a signal transduced by the antenna derives a first received signal containing substantially the same data as in (1) the forward error correction convolutional coded signal having the ⅔ punctured code while the data in the first signal is being received by the receiver and (2) the forward error correction convolutional coded signal having the 6/7 punctured code while the data in the second signal is being received by the receiver. Means responsive to the signal derived by the circuit means derives a third signal that is an approximate replica of the digital data signal. In one embodiment, the digital data signal is derived from a television program signal and the receiver includes means for converting the third signal into a signal for a household television receiver.

In accordance with another aspect of the invention, the forward error correction convolutional encoded signal having the ⅔ punctured code at the receiver includes I and Q parallel channels having sequential bits $P_1(0)$, $P_2(1)$, $P_2(2)$, $P_1(4)$ and $P_2(0)$, $P_1(2)$, $P_2(3)$, $P_2(4)$ respectively in corresponding time slots $t_k$, $t_{k+1}$, $t_{k+2}$, $t_{k+3}$. The circuit means responds to the bits of the I and Q channels to (a) form first and second parallel sequential bit streams such that the sequential bits of the first bit stream in time slots $t_k$, $t_{k+1}$, $t_{k+2}$, $t_{k+3}$ are respectively $P_1(0)$, $X_1$, $P_1(2)$, $X_2$ (where $X_1$ and $X_2$ are dummy bits) and the sequential bits of the second bit stream in the corresponding time slots $t_k$, $t_{k+1}$, $t_{k+2}$, $t_{k+3}$ are respectively $P_2(0)$, $P_2(1)$, $P_2(2)$, $P_2(3)$, and (b) signal that bits $X_1$ and $X_2$ of the first bit stream are dummy bits.

In one embodiment, the circuit means of the receiver for forming the first and second parallel sequential bit steams includes means for coupling the sequential bits of the I and Q channels into a serial bit stream having sequential bits $P_1(0)$, $P_2(0)$, $P_2(1)$, $P_1(2)$, $P_2(2)$, $P_2(3)$, $P_1(4)$, $P_2(4)$.

In a further aspect of the invention, the forward error correction convolutional encoded signal having the 6/7 punctured code at the receiver includes I and Q parallel channels having sequential bits $P_1(0)$, $P_2(1)$, $P_1(3)$, $P_1(5)$, $P_2(6)$, $P_2(8)$, $P_2(10)$, and $P_2(0)$, $P_2(2)$, $P_2(4)$, $P_1(6)$, $P_2(7)$, $P_1(9)$, $P_1(11)$ respectively in corresponding time slots $t_k$, $t_{k+1}$, $t_{k+2}$, $t_{k+3}$, $t_{k+4}$, $t_{k+5}$, $t_{k+6}$. The circuit means at the receiver responds to the bits of the I and Q channels to (a) form first and second parallel sequential bit streams such that the sequential bits of the first bit stream in time slots $t_{k+1}$, $t_{k+2}$, $t_{k+3}$, $t_{k+4}$, $t_{k+5}$, $t_{k+6}$, $t_{k+7}$, $t_{k+8}$, $t_{k+9}$, $t_{k+10}$, $t_{k+11}$, $t_{k+12}$ are respectively $P_1(0)$, $X_3$, $X_4$, $P_1(3)$, $X_5$, $P_1(5)$, $P_1(6)$, $X_6$, $X_7$, $P_1(9)$, $X_8$, $P_1(11)$ and the sequential bits of the second bit stream in the corresponding time slots $t_{k+1}$, $t_{k+2}$, $t_{k+3}$, $t_{k+4}$, $t_{k+5}$, $t_{k+6}$, $t_{k+7}$, $t_{k+8}$, $t_{k+9}$, $t_{k+10}$, $t_{k+11}$, $t_{k+12}$ are respectively $P_2(0)$, $P_2(1)$, $P_2(2)$, $X_9$, $P_2(4)$, $X_{10}$, $P_2(6)$, $P_2(7)$, $P_2(8)$, $X_{11}$, $P_2(10)$, $X_{12}$ (where $X_3$-$X_{12}$ are dummy bits), and (b) signal that the bits in time slots $t_{k+2}$, $t_{k+3}$, $t_{k+5}$, $t_{k+8}$, $t_{k+9}$, $t_{k+11}$ of the first bit stream and that the bits in time slots $t_{k+4}$, $T_{k+6}$, $t_{k+10}$, $t_{k+12}$ of the second bit stream are dummy bits.

In one embodiment, the circuit means at the receiver for forming the first and second parallel sequential bit streams includes means for coupling the sequential bits of the I and Q channels into a serial bit stream having sequential bits $P_1(0)$, $P_2(0)$, $P_2(1)$, $P_2(2)$, $P_1(3)$, $P_2(4)$, $P_1(5)$, $P_1(6)$, $P_2(6)$, $P_2(7)$, $P_2(8)$, $P_1(9)$, $P_2(10)$, $P_1(11)$.

An additional aspect of the invention is directed to a forward error correction method wherein input bits representing an intelligence signal are encoded at a transmitter into first and second parallel different sequential bit streams such that (a) a plurality of the input bits is converted into multiple bits of each of the first and second parallel bit streams, and (b) the first and second parallel bit streams have corresponding sequential time slots 1, 2 . . . j . . . M so there is in each time slot a bit of each bit stream. The first and second parallel bit streams are combined and punctured into a serial punctured bit stream having time slots 1, 2 . . . k . . . N, so that: (a) for the time slot $j_1$, having no undeleted bits, (i) time slots $k_1$ and $(k_1+1)$ respectively have therein the bits in time slot $j_1$ of the first and second bit streams, (ii) time slot $(k_1-1)$ has a bit therein resulting from a bit in time slot $(j_1-1)$ of the first and second bit streams provided time slot ($j_1 - 1$) of the first and second bit streams has at least one undeleted bit, and (iii) time slot ($k_1 + 2$) has a bit therein resulting from a bit in time slot ($j_1 + 1$) provided time slot ($j_1 + 1$) of the first and second bit streams has at least one undeleted bit; (b) for the time slot $j_2$ of the first and second bit streams having one undeleted bit and one deleted bit, (i) time slot $k_2$ has the undeleted bit, (ii) time slot ($k_2 - 1$) has a bit therein resulting from a bit in time slot ($j_2 - 1$) of the first and second bit streams provided time slot ($j_2 - 1$) of the first and second bit streams has at least one undeleted bit, time slot ($k_2 + 1$) has a bit therein resulting from a bit in time slot ($j_{2+1}$) of the first and second bit streams provided time slot ($j_{2+1}$) of the first and second bit streams has at least one undeleted bit; and (c) for the time slot $j_3$ of the first and second bit streams having only deleted bits there is no time slot in the serial deleted bit stream. Plural parallel punctured bit streams including the bits of the serial bit stream are derived in response to the serial stream. A carrier is modulated in response to bits of the plural parallel punctured bit streams so that the carrier is simultaneously modulated by the plural parallel bit streams. At a receiver, the transmitted modulated carrier is converted into fifth and sixth parallel bit streams similar to the plural parallel bit streams and the fifth and sixth bit streams are decoded into a signal similar to the intelligence signal.

In accordance with another aspect of the invention, an apparatus for use in a receiver in a transmission system having forward error correction with punctured convolutional encoded bit streams comprises means responsive to a signal received by the receiver for deriving a first serial punctured bit stream having a first bit rate. The first serial stream is similar to a serial punctured bit stream at a transmitter to which the receiver is responsive. A first in first out register has a clock input terminal, a clock output terminal, a data input and a data output. The data input is responsive to the first serial punctured bit stream. A second convolutional encoded serial bit stream having a second data bit rate is derived at the output. Clock means derives a channel bit wavetrain and a punctured clock wavetrain. The clock input terminal is responsive to the channel bit clock wavetrain. A circuit responsive to the punctured clock wavetrain derives a wavetrain that is applied to the clock output terminal. This apparatus can be used with all of the optimum puncturing codes and rates disclosed by Yasuda et al. and thus is universally applicable.

In a preferred embodiment, the receiver including the universal apparatus responds to a modulated wave including first and second channels. The means for deriving the first serial punctured bit stream responds to the modulated wave to derive a pair of parallel bit streams containing the channel bits of the first and second channels. The pair of parallel bit streams containing the channel bits of the modulated wave are combined to derive the first bit stream.

In a further aspect of the invention, a forward error correction transmitting method comprises encoding input intelligence representing bits into a pair of convolutional encoded bit streams respectively including sequential bits $P_1(0)$, $P_1(1)$, $P_1(2)$, $P_1(3)$, $P_1(4)$ and $P_2(0)$, $P_2(1)$, $P_2(2)$, $P_2(3)$, $P_2(4)$. The convolutional encoded bit streams are punctured at a ⅔ code rate to derive first and second parallel rate-⅔ punctured bit streams respectively including sequential bits $P_1(0)$, $P_2(1)$, $P_2(2)$, $P_1(4)$ and $P_2(0)$, $P_1(2)$, $P_2(3)$, $P_2(4)$. A carrier is modulated in response to the punctured bit streams so that at time $t_1$ the carrier is modulated by $P_1(0)$ and $P_2(0)$, at time $t_2$ the carrier is modulated by $P_2(1)$ and $P_1(2)$, at time $t_3$ the carrier is modulated by $P_2(2)$ and $P_2(3)$, and at time $t_4$ the carrier is modulated by $P_1(4)$ and $P_2(4)$.

Another aspect of the invention is directed to a forward error correction transmitting method wherein input bits representing the intelligence bits are encoded into a pair of convolutional encoded bit streams respectively including sequential bits $P_1(0)$, $P_1(1)$, $P_1(2)$, $P_1(3)$, $P_1(4)$, $P_1(5)$, $P_1(6)$, $P_1(7)$, $P_1(8)$, $P_1(9)$, $P_1(10)$, $P_1(11)$ and $P_2(0)$, $P_2(1)$, $P_2(2)$, $P_2(3)$, $P_2(4)$, $P_2(5)$, $P_2(6)$, $P_2(7)$, $P_2(8)$, $P_2(9)$, $P_2(10)$, $P_2(11)$. The convolutional encoded bit streams are punctured at a 6/7 code rate to derive first and second parallel rate 6/7 punctured bit streams respectively including sequential bits $P_1(0)$, $P_2(1)$, $P_1(3)$, $P_1(5)$, $P_2(6)$, $P_2(8)$, $P_2(10)$ and $P_2(0)$, $P_2(2)$, $P_2(4)$, $P_1(6)$, $P_2(7)$, $P_1(9)$, $P_1(11)$. A carrier is modulated in response to the first and second parallel punctured bit streams so that at time $t_1$ the carrier is simultaneously modulated by $P_1(0)$ and $P_2(0)$, at time $t_2$ the carrier is simultaneously modulated by $P_2(1)$ and $P_2(2)$, at time $t_3$ the carrier is simultaneously modulated by $P_1(3)$ and $P_2(4)$, at time $t_4$ the carrier is simultaneously modulated by $P_1(5)$ and $P_1(6)$, at time $t_5$ the carrier is simultaneously modulated by $P_2(6)$ and $P_2(7)$, at time $t_6$ the carrier is simultaneously modulated by $P_2(8)$ and $P_1(9)$, and at time $t_7$ the carrier is simultaneously modulated by $P_2(10)$ and $P_1(11)$.

An added aspect of the invention is directed to a forward error correction receiver responsive to a signal containing I and Q channels including punctured convolutional encoded bits having a data rate, a punctured code and a puncturing pattern. The receiver comprises means responsive to the I and Q channels for combining the bits thereof into a single serial signal such that the I and Q channel bits in time slot $t_k$ are respectively consecutive bits $b_j$ and $b_{j+1}$ of the single serial signal, where $t_k$ is each of plural consecutive time slots $t_1, t_2 \ldots t_N$. A data clock derives clock pulses having a puncturing pattern corresponding with the puncturing pattern of the I and Q channels. Means responsive to the serial signal and the clock pulses of the data clock derives first and second parallel output bit streams each including sequential time slots containing bits from both the I and Q channels. Means responsive to clock pulses of the data clock derives third and fourth parallel bit streams respectively including bits for indicating the presence of dummy bits in the I and Q channels. The bits of the first and third parallel output bit streams in corresponding time slots are such that the bits of the third output bit stream indicate a dummy bit is in the first output bit stream from the Q channel. The remaining bits in the first output bit stream are bits only from the I channel. The bits of the second and fourth parallel output bit streams in corresponding time slots are such that the bits of the fourth output bit stream indicate a dummy bit is in the second output bit stream from the I channel. The remaining bits in the second output bit stream are bits only from the Q channel. Such a receiver can handle all of the optimum puncturing codes. The means for deriving the third and fourth output bit streams preferably includes a memory for storing the binary bits corresponding to the puncturing patterns. The memory is addressed in response to the clock pulses of the data clock.

Another aspect of the invention concerns a method of receiving a forward error correction convolutional encoded signal punctured at a rate ⅔ and including I and Q parallel channels respectively having sequential bits $P_1(0)$, $P_2(1)$, $P_2(2)$, $P_1(4)$ and $P_2(0)$, $P_1(2)$, $P_2(3)$, $P_2(4)$ in corresponding time slots $t_k$, $t_{k+1}$, $t_{k+2}$, $t_{k+3}$. In response to the bits of the I and Q channels, first and second parallel sequential bit streams are derived such that the sequential bits of the first bit stream in time slots $t_k$, $t_{k+1}$, $t_{k+2}$, $t_{k+3}$ are respectively $P_1(0)$, $X_1$, $P_1(2)$, $X_2$, where $X_1$ and $X_2$ are dummy bits and the sequential bits of the second bit stream in the corresponding time slots $t_k$, $t_{k+1}$, $t_{k+2}$, $t_{k+3}$ are respectively $P_2(0)$, $P_2(1)$, $P_2(2)$, $P_2(3)$. Bits $X_1$ and $X_2$ of the first bit stream are signalled as dummy bits. Preferably the first and second parallel sequential bit streams are formed by coupling the sequential bits of the I and Q channels into a serial bit stream having sequential bits $P_1(0)$, $P_2(0)$, $P_2(1)$, $P_1(2)$, $P_2(2)$, $P_2(3)$, $P_1(4)$, $P_2(4)$.

The invention is also directed to a method of receiving a forward error correction convolutional encoded signal punctured at a rate 6/7 including I and Q parallel channels respectively having sequential bits $P_1(0)$, $P_2(1)$, $P_1(3)$, $P_1(5)$, $P_2(6)$, $P_2(8)$, $P_2(10)$, and $P_2(0)$, $P_2(2)$, $P_2(4)$, $P_1(6)$, $P_2(7)$, $P_1(9)$, $P_1(11)$ in corresponding time slots $t_k$, $t_{k+1}$, $t_{k+2}$, $t_{k+3}$, $t_{k+4}$, $t_{k+5}$, $t_{k+6}$. In response to the bits of the I and Q channels first and second parallel sequential bit streams are derived such that the sequential bits of the first bit stream in time slots $t_{k+1}$, $t_{k+2}$, $t_{k+3}$, $t_{k+4}$, $t_{k+5}$, $t_{k+6}$, $t_{k+7}$, $t_{k+8}$, $t_{k+9}$, $t_{k+10}$, $t_{k+11}$, $t_{k+12}$ are respectively $P_1(0)$, $X_3$, $X_4$, $P_1(3)$, $X_5$, $P_1(5)$, $P_1(6)$, $X_6$, $X_7$, $P_1(9)$, $X_8$, $P_1(11)$ and the sequential bits of the second bit stream in the corresponding time slots $t_{k+1}$, $t_{k+2}$, $t_{k+3}$, $t_{k+4}$, $T_{k+5}$, $t_{k+6}$, $t_{k+7}$, $t_{k+8}$, $t_{k+9}$, $t_{k+10}$, $t_{k+11}$, $t_{k+12}$ are respectively $P_2(0)$, $P_2(1)$, $P_2(2)$, $X_9$, $P_2(4)$, $X_{10}$, $P_2(6)$, $P_2(7)$, $P_2(8)$, $X_{11}$, $P_2(10)$, $X_{12}$ (where $X_3$-$X_{12}$ are dummy bits). The bits in time slots $t_{k+2}$, $t_{k+3}$, $t_{k+5}$, $t_{k+8}$, $t_{k+9}$, $t_{k+11}$ of the first bit stream and the bits in time slots $t_{k+4}$, $T_{k+6}$, $t_{k+10}$, $t_{k+12}$ of the second bit stream are signalled as dummy bits. Preferably the first and second parallel sequential bit streams are formed by coupling the sequential bits of the I and Q channels into a serial bit stream having sequential bits $P_1(0)$, $P_2(0)$, $P_2(1)$, $P_2(2)$, $P_1(3)$, $P_2(4)$, $P_1(5)$, $P_1(6)$, $P_2(6)$, $P_2(7)$, $P_2(8)$, $P_1(9)$, $P_2(10)$, $P_1(11)$.

An additional aspect of the invention involves transmitting a forward error correction convolutional encoded signal having a first convolutional encoded bit stream of sequential bits $P_1(0)$, $P_1(1)$, $P_1(2)$, $P_1(3)$, $P_1(4)$ and a second convolutional encoded bit stream of sequential bits $P_2(0)$, $P_2(1)$, $P_2(2)$, $P_2(3)$, $P_2(4)$ by puncturing only every other bit of the first bit stream to derive a punctured first bit stream and responding to the punctured first bit stream and the second bit stream to derive parallel I and Q channels. Four sequential time slots $t_k$, $t_{k+1}$, $t_{k+2}$, $t_{k+3}$ of the I channel respectively consist of bits $P_1(0)$, $P_2(1)$, $P_2(2)$, $P_1(4)$ and the corresponding time slots $t_k$, $t_{k+1}$, $t_{k+2}$, $t_{k+3}$ of the Q channel respectively consist of bits $P_2(0)$, $P_1(2)$, $P_2(3)$, $P_2(4)$. A carrier is simultaneously modulated with the two bits of the I and Q channels in time slots $t_k$, $t_{k+1}$, $t_{k+2}$, $t_{k+3}$.

The invention is also directed to transmitting a forward error correction convolutional encoded signal having a first convolutional encoded bit stream of sequential bits $P_1(0)$, $P_1(1)$, $P_1(2)$, $P_1(3)$, $P_1(4)$, $P_1(5)$, $P_1(6)$, $P_1(7)$, $P_1(8)$, $P_1(9)$, $P_1(10)$, $P_1(11)$ and a second convolutional encoded bit stream of sequential bits $P_2(0)$, $P_2(1)$, $P_2(2)$, $P_2(3)$, $P_2(4)$, $P_2(5)$, $P_2(6)$, $P_2(7)$, $P_2(8)$, $P_2(9)$, $P_2(10)$, $P_2(11)$, by puncturing (a) every sequence of six bits of the first convolutional encoded bit stream so only the bits in second, third and fifth time slots of the sequence are punctured to derive a punctured first bit stream, and (b) puncturing every sequence of six bits of the second convolutional encoded bit stream so only the bits in fourth and sixth time slots of the sequence are punctured to derive a punctured second bit stream. The sequences of the first and second convolutional encoded bit streams have corresponding first through sixth time slots. By responding to the punctured first and second bit streams there are derived parallel I and Q channels wherein seven sequential time slots $t_k$, $t_{k+1}$, $t_{k+2}$, $t_{k+3}$, $t_{k+4}$, $t_{k+5}$, $T_{k+6}$ of the I channel respectively consist of bits $P_1(0)$, $P_2(1)$, $P_1(3)$, $P_1(5)$, $P_2(6)$, $P_2(8)$, $P_2(10)$ and the corresponding time slots $t_k$, $t_{k+1}$, $t_{k+2}$, $t_{k+3}$, $t_{k+4}$, $t_{k+5}$, $T_{k+6}$ of the Q channel respectively consist of bits $P_2(0)$, $P_2(2)$, $P_2(4)$, $P_1(6)$, $P_2(7)$, $P_1(9)$, $P_1(11)$. A carrier is simultaneously modulated with the two bits of the I and Q channels in time slots $t_k$, $t_{k+1}$, $t_{k+2}$, $t_{k+3}$, $t_{k+4}$, $t_{k+5}$, $t_{k+6}$.

The invention is also directed to a receiver responsive to a plural channel (I and Q) convolutional encoded data signal punctured at a predetermined rate. The receiver comprises means responsive to the plural channels of the signal for deriving a serial signal having sequential bits so sequential bits I(0), I(1), I(2) etc. of time slots $t_k$, $t_{k+1}$, $t_{k+2}$, of channel I and sequential bits Q(0), Q(1), Q(2) etc. of channel Q at the same time slots $t_k$, $t_{k+1}$, $t_{k+2}$ are sequentially derived in the serial signal as I(0), Q(0), I(1), Q(1), I(2), Q(2) etc. A punctured clock synchronized with the sequential bits of the serial signal is derived. The punctured clock synchronized with the sequential bits of the serial signal is combined with the sequential bits of the serial signal. A pair of output wavetrains $G_1$ and $G_2$ including the sequential bits of the I and Q channels and dummy bits inserted into the serial signal is derived. Bit trains $G_1$ and $G_2$ include bits of the I and Q channels. A means for indicating which of the bits in bit trains $G_1$ and $G_2$ are dummy bits is provided.

Additionally the invention is directed to a receiver responsive to a received first and second channel (I and Q) forward error correction convolutional encoded data signal punctured at a predetermined rate. The data signal is received from a transmitter wherein first and second ½ rate encoded data wavetrains are derived and the ½ rate convolutional encoded data wavetrains are converted into punctured I and Q channels that are approximately the same as the received forward error correction convolutional encoded data signal. The I channel at the transmitter includes sequential bits of the first and second signals in different time slots; the Q channel at the transmitter includes other sequential bits of the first and second signals in other different time slots. The receiver comprises means responsive to the plural channels of the signal at the receiver for deriving a serial signal having sequential bits so sequential bits I(0), I(1), I(2) etc. of time slots $t_k$, $t_{k+1}$, $t_{k+2}$, of received channel I and sequential bits Q(0), Q(1), Q(2) etc. of received channel Q at the same time slots $t_k$, $t_{k+1}$, $t_{k+2}$ are sequentially derived in the serial signal as I(0), Q(0), I(1), Q(1), I(2), Q(2) etc. A punctured clock synchronized with the sequential bits of the serial signal is derived and combined with the sequential bits of the serial signal. A pair of output wavetrains $G_1$ and $G_2$ including the sequential bits of the received I and Q channels and dummy bits inserted into the serial signal is derived. Bit train $G_1$ includes only bits of the first wavetrain and dummy bits, while bit train $G_2$ includes only bits of the second wavetrain and dummy bits. The dummy bits in bit trains $G_1$ and $G_2$ are indicated.

In one embodiment, the receiver includes a multiplexer having first and second inputs respectively responsive to the received I and Q channels and an output terminal for deriving the serial signal. A clock source activates the multiplexer so the I channel and the Q channel are coupled to the output terminal once at different times during a single symbol time of the received I and Q channels. Preferably, the means for deriving the pair of output wavetrains includes circuitry clocked by the punctured clock and responsive to the serial signal for deriving bit trains $G_1$ and $G_2$ at the frequency of the first and second ½ rate convolutional encoded data wavetrains. In one embodiment, the clocked circuitry includes a first in/first out register having signal input and output terminals and clock input and clock output terminals; the clock output terminal responds to the punctured clock. The signal input terminal is responsive to the multiplexer output, while the clock input terminal responds to a clock having a frequency causing clocking of every bit at the multiplexer output terminal into the register. A serial to parallel converter having an input responsive to the register output includes a pair of output terminals on which the $G_1$ and $G_2$ bit trains are derived.

The above and still further objects, features and advantages of the present invention will become apparent upon consideration of the following detailed descriptions of several specific embodiments thereof, especially when taken in conjunction with the accompanying drawings.

DESCRIPTION OF THE DRAWINGS

Figure 1:
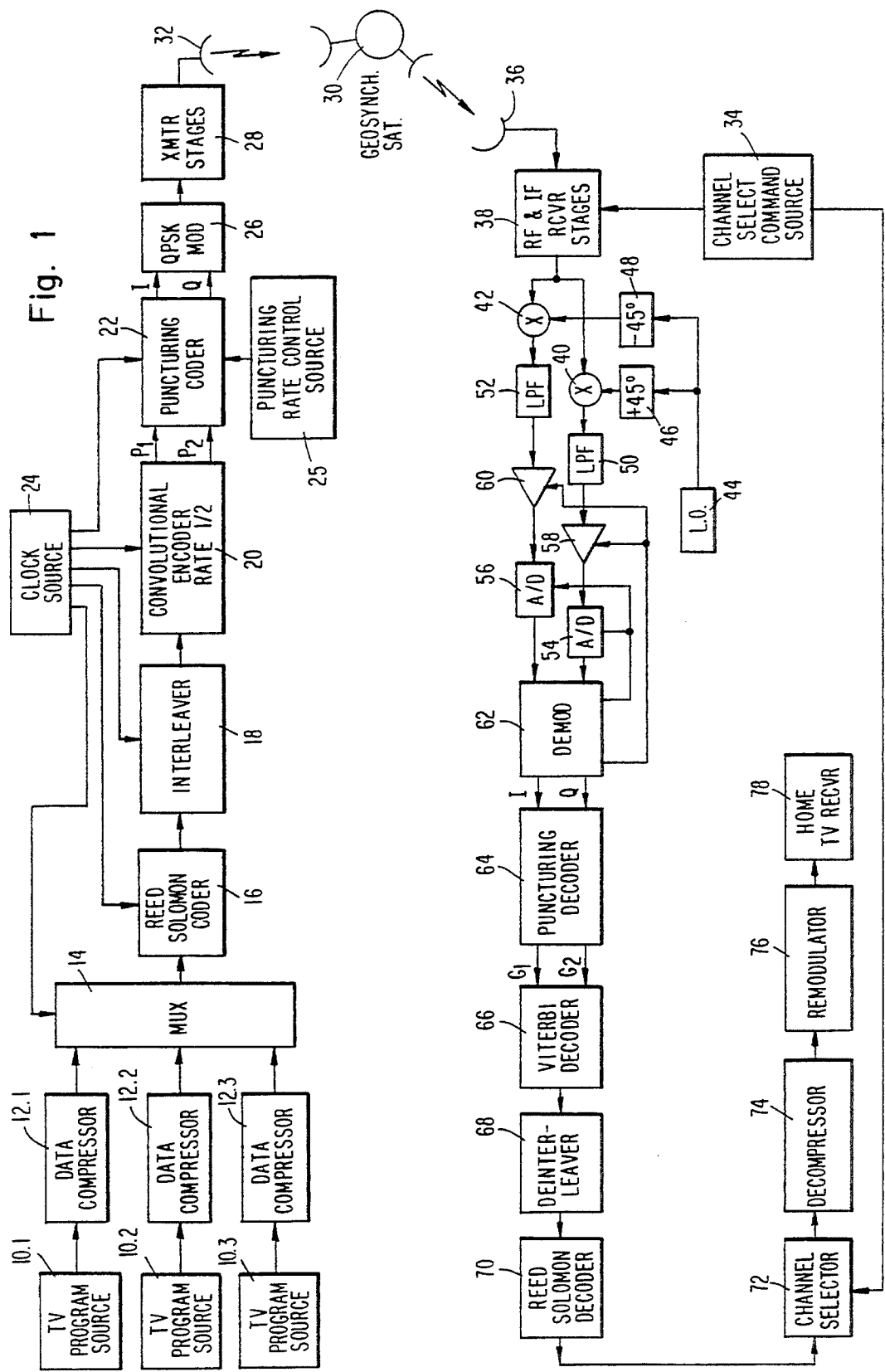
FIG. 1 is an overall system block diagram of a feed forward error correction data transmitting and receiving method and apparatus in accordance with a preferred embodiment of the present invention.

Reference is now made to FIG. 1, a block diagram of a complete system including certain features of the present invention, wherein television program sources 10.1, 10.2 and 10.3 respectively supply baseband audio and video signals to data compressors 12.1, 12.2 and 12.3. Compressors 12.1, 12.2 and 12.3 derive sequential binary bit wavetrains respectively indicative of frequency compressed versions of audio and video information of sources 10.1, 10.2, 10.3. The binary wavetrains derived from compressors 12.1, 12.2 and 12.3 are combined in time division multiplexer 14 to form a single binary signal that is supplied to Reed-Solomon encoder 16. The resulting serial binary bit wavetrain derived from Reed-Solomon encoder 16 is supplied to conventional interleaver 18, having an output feed to one-half rate convolutional encoder 20. Convolutional encoder 20 derives a pair of parallel binary bit streams $P_1$ and $P_2$ having sequential bits $P_1(0)$, $P_1(1)$, $P_1(2)$ etc. and $P_2(0)$, $P_2(1)$, $P_2(2)$ in time slots 0, 1, 2 etc. The $P_1$ and $P_2$ outputs of encoder 20 are punctured by puncturing encoder 22. Each of multiplexers 14, coder 16, interleaver 18 and coder 22 is responsive to pulses from clock source 24. Puncturing encoder 22 responds to signals from encoder 22 and clock source 24, as well as a punctured code command signal from operator controlled source 25, to derive a pair of parallel punctured serial binary bit streams which are applied to I and Q inputs of quadrature phase shift key modulator 26.

Modulator 26 responds to the binary bit streams supplied to it to derive a quadrature phase shift key wavetrain, supplied to transmitter 28, having an output radiated by antenna 32 to a transponder or repeater on geosynchronous satellite 30. Circuitry on geosynchronous satellite 30 responds to the signal from transmitter 28 and antenna 32 to emit a microwave signal having an extremely wide beam width to numerous terrestrial receiving sites, one of which is illustrated in FIG. 1. The signal transmitted from satellite 30 to the terrestrial receiving site is typically in either C or Ku band.

A typical terrestrial receiving site includes reflecting antenna dish 36 having a diameter no greater than approximately one meter and optimally having a parabolic shape; in first and second specific embodiments, antenna dish 36 respectively has diameters of 60 and 90 centimeters. The signal transduced by an active element coupled with dish 36 is amplified and down converted to an IF frequency by RF and IF stages 38 responsive to an operator controlled channel select signal from source 34. Stages 38 have an IF analog output applied in parallel to mixers 40 and 42, driven by the output of fixed frequency local oscillator 44 via ±45° phase shifters 46 and 48. The outputs of mixers are supplied to matched lowpass filters 50 and 52, having I and Q baseband outputs that are respectively applied to analog to digital converters 54 and 56 via variable gain amplifiers 58 and 60 for normalizing the amplitude of the input signals to the converters so the maximum analog input level applied to the converters equals the maximum voltage level the converters are designed to handle. Converters 54 and 56 respond to the I and Q baseband signals supplied to them to derive multi-bit digital signals having values commensurate with the magnitude and polarity of the I and Q baseband signals supplied to the converters so the most significant bits derived from the converters represent polarity while the remaining bits represent amplitude.

Analog to digital converters 54 and 56 respond to the analog outputs of amplifiers 58 and 60 and to sampling pulses to derive multi-bit digital signals which are supplied to demodulator 62, preferably configured as disclosed in the co-pending, commonly assigned application Ser. No. 07/998,300 of Itzhak Gurantz, Yoav Goldenberg and Sree Raghavan, entitled "Demodulator for Consumer Uses," filed Dec. 30, 1992. Demodulator 62 derives (1) sampling pulses which are supplied to analog to digital converters 54 and 56, (2) gain control signals for variable gain amplifiers 58 and 60, (3) a carrier tracking error signal used in the demodulator to correct for frequency and phase errors of local oscillator 44 relative to the frequency and phase of the IF output of stages 38, and (4) I and Q channel output signals. For each sample taken by converters 54 and 56 demodulator 62 derives three parallel binary output bits in each of the I and Q output channels thereof. The most significant bit of each triad of bits represents the polarity of the sample, as corrected by the carrier tracking circuit, and the two additional binary bits provide a measure of the quality of the first bit, as corrected by the carrier tracking circuit. The most significant bit of each three bit triad in the output of demodulator 62 thus indicates the binary value associated with each sample taken by converters 54 and 56 and the two least significant bits indicate a confidence factor for the binary value of the most significant bit.

The I and Q channel output signals of demodulator 62 are supplied to puncturing decoder 64, set for the punctured code of puncturing coder 22 at the transmitter, i.e., either ⅔ or 6/7. Decoder 64 is set by an operator for the correct punctured code or the rate can be automatically controlled. Puncturing decoder 64 responds to the I and Q outputs of demodulator 62 to derive binary indication of each sample taken by converters 54 and 56; the binary outputs of decoder 64 associated with the I and Q channels derived by demodulator 62 are data sequences respectively indicated as $G_1$ and $G_2$. Decoder 64 also derives on leads 65 and 67 signals indicating whether or not the simultaneously derived $G_1$ and $G_2$ outputs thereof are dummy bits. Puncturing decoder 64 also inserts dummy bits in time slots corresponding to the time slots which were punctured, i.e., deleted, by puncturing coder 22 at the transmitter and derives a punctured data clock having a rate corresponding and synchronized with the $G_1$ and $G_2$ data sequences.

All of the aforementioned outputs of puncturing decoder 64 are supplied to Viterbi decoder 66 which derives a single serial binary signal train that is quite similar to the binary wavetrain applied to encoder 20. The binary serial signal train derived by Viterbi decoder 66 is supplied to de-interlever 68, having an output supplied to Reed-Solomon decoder 70, having a multi-bit serial output that is an approximate replica of the signal supplied to Reed-Solomon coder 16 at the transmitter.

The binary output signal of Reed-Solomon decoder 70 is applied to channel selector 72, responsive to the channel select signal from a television receiver at the receiver site. Channel selector 72 selects the binary bits in the output of Reed-Solomon decoder 70 associated with the television program source 10.1, 10.2 or 10.3 selected by a user of the television receiver at the receiving site. The binary bits associated with the selected program source are coupled to video decompressor 74 to the exclusion of the binary bits associated with the other program sources at the transmitter site. Video decompressor 74 responds to the binary signal values supplied to it to derive an analog signal that is an approximate replica of the audio and video information of the selected one of program sources 10.1–10.3.

The analog output signal of decompressor 74 is supplied to remodulator 76 which converts the signal supplied to it to a conventional television signal in any of the usual formats, such as NTSC, PAL, or SECAM. The signal derived from remodulator 76 is modulated on a standard broadcast television carrier frequency, such as the carrier frequency associated with channel 3 or 4, as selected by a switch at the receiver site. The standard television signal thereby derived by remodulator 76 is supplied to conventional home television receiver 78. Alternatively, elements similar to elements 38–76 are incorporated in a home television receiver.

The system of FIG. 1 has been previously proposed by others, except that the previously proposed punctured codes for puncturing coder 22 and puncturing decoder 64 were ⅔ and ⅚. It has been previously established that the ⅔ punctured code is to be emitted from the circuitry on satellite 30 at the 10-watt level and that the other punctured code is to be emitted from the satellite at 20 watts. By performing a bit error ratio analysis, we found the ⅚ punctured code is excessive for successful operation of the system with 20-watt emissions from geosynchronous satellite 30, but that 20-watt emissions at a 6/7 punctured code is acceptable.

When coder 22 is set for puncturing at the ⅔ rate, bits $P_1(0)$, $P_1(1)$, $P_1(2)$, $P_1(3)$, $P_1(4)$ in bit stream P1 in time slots $t_0$, $t_1$, $t_2$, $t_3$, $t_4$ and bits $P_2(0)$, $P_2(1)$, $P_2(2)$, $P_2(3)$, $P_2(4)$ in bit stream P2 in the corresponding time slots, are converted by puncturing coder 23 into I and Q signals that are supplied to modulator 26 in accordance with:

TABLE IV

| | $t_k$ | $t_{k+1}$ | $t_{k+2}$ | $t_{k+3}$ |
|---|---|---|---|---|
| I | $P_1(0)$ | $P_2(1)$ | $P_2(2)$ | $P_1(4)$ |
| Q | $P_2(0)$ | $P_1(2)$ | $P_2(3)$ | $P_2(4)$ | where $t_k$, $t_{k+1}$, $t_{k+2}$, $t_{k+3}$ are sequential time slots for the output of coder 22.

Coder 22 responds to subsequent bits in bit streams $P_1$ and $P_2$ in a manner similar to that described for bits $P_1(0)$ $P_1(4)$ and bits $P_2(0)$ $P_2(4)$ to derive subsequent I and Q outputs of the coder. To these ends, coder 22 includes a puncturing code for bits $P_1(0)$, $P_1(1)$, $P_2(0)$, $P_2(1)$ in accordance with

TABLE V

| | $t_0$ | $t_1$ |
|---|---|---|
| $ER_1$ | 1 | 0 |
| $ER_2$ | 1 | 1 | where $ER_1$ is the puncturing code for bits $P_1(0)$, $P_1(1), \ldots P_1(t_j), P_1(t_{j+1})$
$ER_2$ is the puncturing code for bits $P_2(0)$, $P_2(1) \ldots P_2(t_j), P_2(t_{+1})$
$t_j$ is an even numbered time slot
1 indicates the bit is not punctured
0 indicates the bit is punctured.

The puncturing code of Table V is applied to bit streams $P_1$ and $P_2$ as follows:

TABLE VI

| $P_1$ | $P_1(0)$ | X | $P_1(2)$ | X | $P_1(4)$ |
| $P_2$ | $P_2(0)$ | $P_2(1)$ | $P_2(2)$ | $P_2(3)$ | $P_2(4)$ | where X indicates the bit is punctured.

In one preferred embodiment of the invention, the unpunctured bits of Table VI are formed into a serial signal in accordance with: $P_1(0),P_2(0),P_2(1),P_1(2),P_2(2),P_2(3),P_1(4),P_2(4)$ (1). Odd numbered bits in Expression (1), i.e., bits $P_1(0)$, $P_2(1)$, $P_2(2)$, $P_1(4)$, are coupled by coder 22 to the coder I output, while even numbered bits in Expression (1), i.e., bits $P_2(0)$, $P_1(2)$, $P_2(3)$, $P_2(4)$, are coupled to the coder Q output thereby to form the I and Q bit sequences of Table IV.

When puncturing coder 22 is set to puncture at the 6/7 rate, sequential bits in time slots $t_0$–$t_{11}$ of the $P_1$ and $P_2$ outputs of encoder 20 are converted by coder 22 into I and Q channel output signals in accordance with

TABLE VII

|   | $t_k$ | $t_{k+1}$ | $t_{k+2}$ | $t_{k+3}$ | $t_{k+4}$ | $t_{k+5}$ | $t_{k+6}$ |
|---|---|---|---|---|---|---|---|
| I | $P_1(0)$ | $P_2(1)$ | $P_1(3)$ | $P_1(5)$ | $P_2(6)$ | $P_2(8)$ | $P_2(10)$ |
| Q | $P_2(0)$ | $P_2(2)$ | $P_2(4)$ | $P_1(6)$ | $P_2(7)$ | $P_1(9)$ | $P_1(11)$ |

Coder 22 responds to subsequent bits in bit streams $P_1$ and $P_2$ in a manner similar to that described for bits $P_1(0)P_1(11)$ and $P_2(0)$ $P_2(11)$ to derive subsequent I and Q output bits of the coder. To these ends, coder 22 includes a puncturing code for bits $P_1(0)$ $P_1(5)$ and $P_2(0)$ $P_2(5)$ in accordance with:

TABLE VIII

|   | $t_1$ | $t_{j+1}$ | $t_{j+2}$ | $t_{j+3}$ | $t_{j+4}$ | $t_{j+5}$ |
|---|---|---|---|---|---|---|
| $ER_1$ | 1 | 0 | 0 | 1 | 0 | 1 |
| $ER_2$ | 1 | 1 | 1 | 0 | 1 | 0 |

In one embodiment, the puncturing code of Table VIII is applied to bit streams $P_1$ and $P_2$ as follows:

TABLE IX

| $P_1$ | $P_1(0)$ | X | X | $P_1(3)$ | X | $P_1(5)$ | $P_1(6)$ | $P_1(7)$ | $P_1(8)$ | $P_1(9)$ | $P_1(10)$ | $P_1(11)$ |
|---|---|---|---|---|---|---|---|---|---|---|---|---|
| $P_2$ | $P_2(0)$ | $P_2(1)$ | $P_2(2)$ | X | $P_2(4)$ | X | $P_2(6)$ | $P_2(7)$ | $P_2(8)$ | $P_2(9)$ | $P_2(10)$ | $P_2(11)$ |

The unpunctured bits of Table IX are formed into a serial signal in accordance with: $P_1(0)$, $P_2(0)$, $P_2(1)$, $P_2(2)$, $P_1(3)$, $P_2(4)$, $P_1(5)$, $P_1(6)$, $P_2(6)$, $P_2(7)$, $P_2(S)$, $P_1(9)$, $P_2(10)$, $P_1(11)$ (2). Odd numbered bits in Expression (2), i.e., bits $P_1(0)$, $P_2(1)$, $P_1(3)$, $P_1(5)$, $P_2(6)$, $P_2(8)$, $P_2(10)$, are coupled to the I output of coder 22, while even numbered bits in Expression (2), i.e., bits $P_2(0)$, $P_2(2)$, $P_2(4)$, $P_1(6)$, $P_2(7)$, $P_1(9)$, $P_1(11)$, are coupled to the Q output of the coder, thereby to form the bit sequences of Table VII.

Similarly, but in an opposite manner, decoder 64 is set to punctured code ⅔ or 6/7. Decoder 64 responds to the I and Q output signals of demodulator 62 and separates these signals into signals $G_1$ and $G_2$, similar to the $P_1$ and $P_2$ inputs of puncturing coder 22, and designates which bits derived from the decoder are associated with bits which have been punctured by coder 22. Decoder 64 includes puncturing codes identical to the puncturing codes of Tables V and VIII for the ⅔ and 6/7 rates.

When puncturing decoder 64 is set at the ⅔ punctured code, it responds to sequential bits of the I and Q bit streams derived by demodulator 62 and the code of Table V to derive $G_1$ and $G_2$ output signals that are a close replica of the $P_1$ and $P_2$ signals supplied to puncturing coder 22 such that sequential bits $I(0)$ $I(8)$ and $Q(0)$ $Q(8)$ of channels I and Q in time slots $t_0$–$t_{11}$ are derived in accordance with:

TABLE X

| $G_1$ | $I(0)$ | X | $Q(1)$ | X | $I(3)$ | X | $Q(4)$ | X | $I(6)$ | X | G1 | $Q(7)$ | X |
|---|---|---|---|---|---|---|---|---|---|---|---|---|---|
| $G_2$ | $Q(0)$ | $I(1)$ | $I(2)$ | $Q(2)$ | $Q(3)$ | $I(4)$ | $I(5)$ | $Q(5)$ | $Q(6)$ | $I(7)$ | G2 | $I(8)$ | $Q(8)$ | where X designates a "dummy bit," i.e., a bit having a value that is not related to the value of a bit in $I(0)$ $I(8)$ or $Q(0)$ $Q(8)$. To form the bit sequences of Table X in one embodiment, bit sequences $I(0)$ $I(8)$ and $Q(0)$ $Q(8)$ and the deletion pattern of Table V are combined to form a serial sequence including dummy bits X as follows: $I_{(0)}$, $Q_{(0)}$, X, $I_{(1)}$, $Q_{(1)}$, $I_{(2)}$, X, $Q_{(2)}$, $I_{(3)}$, $Q_{(3)}$, X, $I_{(4)}$, $Q_{(4)}$, $I_{(5)}$, X, $Q_{(5)}$, $I_{(6)}$, $Q_{(6)}$, X, $I_{(7)}$, $Q_{(7)}$, $I_{(8)}$, X, $Q_{(8)}$ (3).

Decoder 64 couples the bit sequence of Expression (3) to the $G_1$ and $G_2$ outputs thereof so the odd and even numbered bits of the sequence are respectively derived at the $G_1$ and $G_2$ outputs in accordance with Table X. When puncturing decoder 64 is set at the 6/7 rate, it responds to the sequential bits in the I and Q bit streams at the output of demodulator 62 and the puncturing code of Table VIII to derive $G_1$ and $G_2$ bit sequences in accordance with:

TABLE XI

| $G_1$ | $I(0)$ | X | X | I2 | X | $I(3)$ | $Q(3)$ | X | X | Q5 | X | $Q(6)$ |
|---|---|---|---|---|---|---|---|---|---|---|---|---|
| $G_2$ | $Q(0)$ | $I(1)$ | $Q(1)$ | X | $Q(2)$ | X | $I(4)$ | $Q(4)$ | $I(5)$ | X | $I(6)$ | X |

To form the bit sequences of Table XI in one embodiment, bit sequences $I(0)$ $I(6)$ and $Q(0)$ $Q(6)$ and the deletion pattern of Table VIII are combined to form a serial sequence including dummy bits X as follows:

I(0), Q(0), X, I(1), X, Q(1), I(2), X, X, Q(2), I(3), X,
Q(3), I(4), X, Q(4), X, I(5), Q(5), X, X, I(6), Q(6), X (4).

Decoder 64 couples the bit sequence of Expression (4) to the $G_1$ and $G_2$ outputs thereof so the odd and even numbered bits of the sequence are respectively derived at the $G_1$ and $G_2$ outputs in accordance with Table XI.

Inspections of Tables X and XI indicate there are repetitive dummy bit patterns in these Tables; in Table X the dummy bit pattern repeats after every other pair of time slots; in Table XI the bit pattern of the first six time slots repeats in the second set of time slots. The serial stream of Expression (3) is formed by serializing bit streams I and Q so I(k) is immediately before Q(k) and Q(k) is immediately before I(k+1); then a dummy bit is inserted at the third time slot in each sequence of four bits in the final serialized bit stream; e.g. the first dummy bit follows bits I(0), Q(0) and is immediately before I(1) to form the first four bits in the final serialized bit stream. The serial stream of Expression (4) is formed by serializing bit streams I and Q and inserting dummy bits at the third, fifth, eighth, ninth and twelfth time slots in each sequence of 12 bits in the final serialized bit stream. Insertion of the dummy bits into the final serialized bit streams is controlled by the positions of the "0" values in Tables V and VIII.

Figure 2:
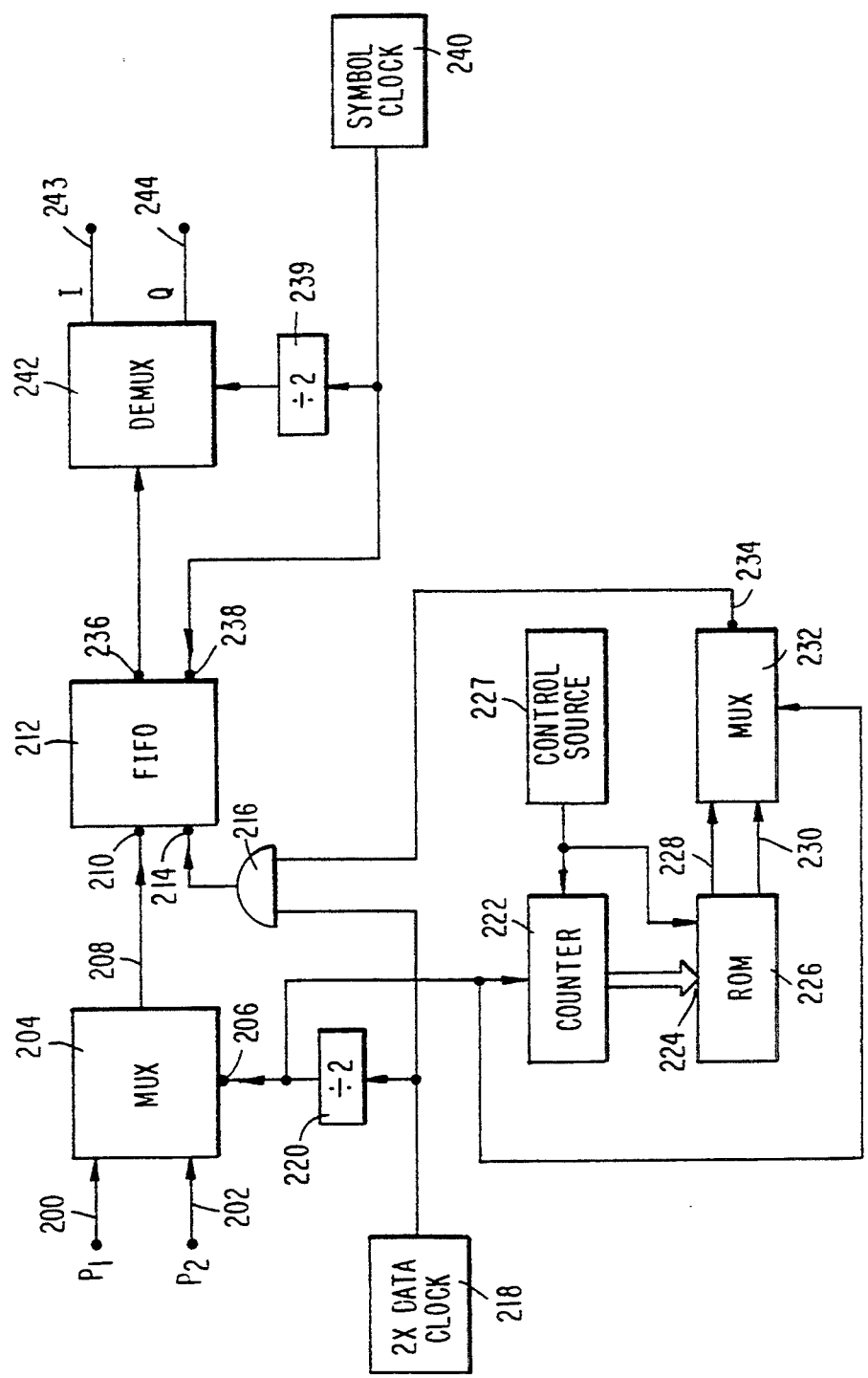
FIG. 2 is a block diagram of a preferred first embodiment of a universal punctured encoder in the transmitter of FIG. 1.

Reference is now made to FIG. 2, a block diagram of a universal apparatus for converting data bit streams $P_1$ and $P_2$ on leads 200 and 202, as derived from convolutional encoder 20, into a pair of punctured I and Q channel bit streams. The apparatus of FIG. 2 can be used on bit streams $P_1$ and $P_2$ for any of the optimum punctured codes disclosed by Yasuda et al., i.e. ½, ⅔, ¾, 4/5, 5/6, 6/7, ⅞, 8/9, 9/10, 10/11, 11/12, 12/13, 13/14, 14/15, 15/16, 16/17. The data bits on leads 200 and 202 are supplied to electronic multiplexer 204, operated at a frequency twice the rate of data on leads 200 and 202 in response to a square wave data clock at terminal 206.

The data clock at terminal 206 and the data on leads 200 and 202 have the same frequency and phase, a result achieved by conventional synchronizing circuitry (not shown). Multiplexer 204 responds to one levels at terminal 206 to switch the signal on lead 200 to output lead 208; in response to a zero level at terminal 206, the signal on lead 202 is coupled to output lead 208.

The resulting serial bit sequence $P_1(0)$, $P_2(0)$, $P_1(1)$, $P_2(1)$, $P_1(2)$, $P_2(2)$ etc. on lead 208 is supplied to data input terminal 210 of first in first out register (FIFO) 212, including clock input terminal 214. Clock input terminal 214 responds to a punctured data clock derived from AND gate 216, having one input responsive to a pulse train from clock source 218, which derives clock pulses that are synchronized with and have a frequency twice the frequency of clock pulses at terminal 206. The clock pulses derived from source 218 are coupled directly to one input of AND gate 216, while input terminal 206 of multiplexer 204 responds to the pulses from clock source 218, as modified by divide by two frequency divider 220.

The other input of AND gate 216 is derived by supplying the data clock output of frequency divider 220 to a count input of counter 222, having a multibit output applied to address input 224 of memory 226. Counter 222 and memory 226 respond to a control signal from source 227 indicative of which of the deletion codes specified in the Yasuda et al. article is to be used. Counter 222 is set to a maximum count in response to the control signal from source 227 and is continuously sequenced from zero to its maximum count by the data clock pulses from divider 220. The count in generator 222 controls the address input of memory 224.

Memory 226 is loaded with a pair of deletion patterns for each of the deletion codes specified in the Yasuda et al. article. Selection of a deletion code is by control source 227. Sequential bits of the two deletion patterns of the selected deletion code are supplied to leads 228 and 230 by memory 226 in response to the sequential addresses supplied to input 224. For example, if the selected deletion code is rate ⅔, generator 222 responds to the first three data clock pulses from divider 220 to supply addresses 0000, 0001, 0000 in sequence to address input 224 and memory 226 responds to these address signals to supply leads 228 and 230 with the sequential binary bits 10 and 11, respectively; the sequences on leads 228 and 230 respectively correspond with the sequences on lines 1 and 2 of Table V. A similar sequence is derived on leads 228 and 230 in response to each succeeding triad of sequential data clock pulses. If control source 227 is set for the 6/7 punctured code, address generator 222 responds to the first six data clock pulses from divider 220 to derive the addresses 0000, 0001, 0010, 0011, 0100, 0101 which cause memory 226 to supply leads 228 and 230 with the binary sequences 100101 and 111010, respectively; these sequences correspond with the sequences on lines 1 and 2 of Table VIII and are repeated for every six sequential data clock pulses.

For the aforementioned ⅔ situation the bit sequences on lead 234 and at the output of AND gate 216 are respectively repeating sequences of 1101 and 10100010; for the 6/7 situation the bit sequences on lead 234 and at the output of AND gate 216 are respectively repeating sequences of 110101100110 and 101000100010100000101000. FIFO 212 responds to the leading edge of each 1 in the output of AND gate 216 to clock the binary value which is simultaneously at terminal 210 into the FIFO. Binary values which occur at terminal 210 while the output AND gate 216 is 0 are not coupled into FIFO 212, hence are deleted, i.e. punctured. For the ⅔ situation, FIFO 212 responds to the serial combination of the $P_1$ and $P_2$ signals at terminal 210 and the punctured clock at terminal 208 to be loaded with the punctured sequence $P_1(0)$, $P_2(0)$, $P_2(1)$, $P_1(2)$, $P_2(2)$, $P_2(3)$, $P_1(4)$, $P_2(4)$ etc. For the 6/7 situation, FIFO 212 is loaded with the punctured sequence $P_1(0)$, $P_2(0)$, $P_2(1)$, $P_2(2)$, $P_1(3)$, $P_2(4)$, $P_1(5)$, $P_1(6)$, $P_2(6)$, $P_2(7)$, $P_2(8)$ etc.

FIFO 212 includes data output terminal 236 and clock terminal 238 for controlling the rate at which bits are supplied by the FIFO to terminal 236. Terminal 238 responds to symbol clock source 240, having a frequency equal to two times the frequency symbols are supplied to I and Q outputs 243 and 244. The clock pulses derived from clock source 240 are supplied via divide by two frequency divider 239 to serial to parallel converter, i.e. demultiplexer, 242, having a data input responsive to pulses at output 236 of FIFO 212. Converter 242 responds to the clock pulses from source 240 such that the signal at terminal 236 is coupled to leads 243 and 244 while the clock pulses have zero and one values, respectively. Because of puncturing, the symbol rate is less than the data rate; in one embodiment the data rate on leads 200 and 202 is 20 megabits per second while the symbol rate on leads 243 and 244 is 15 megabits per second for the ⅔ punctured code.

FIFO 212 responds to the sequence loaded into it and the clock at terminal 238 to derive at terminal 236 the same serial sequence as is loaded into the FIFO at terminal 210. The sequence is read from terminal 236 at the clock frequency applied to terminal 238, which is twice the symbol clock. For the ⅔ rate, demultiplexer 242, which switches at twice the symbol clock rate in response to the opposite levels of the symbol clock frequency output of divider 239, responds to the sequence at terminal 236 so the I(0), I(1), I(2), I(3), I(4) and Q(0), Q(1), Q(2), Q(3), Q(4) sequences on leads 243 and 244 are respectively $P_1(0)$, $P_2(1)$, $P_2(2)$, $P_1(4)$ etc. and $P_2(0)$, $P_1(2)$, $P_2(3)$, $P_2(4)$ etc.; for the 6/7 rate the sequences on leads 243 and 244 are respectively $P_1(0)$, $P_2(1)$, $P_1(3)$, $P_1(5)$, $P_2(6)$, $P_2(8)$, $P_2(10)$ etc. and $P_2(0)$, $P_2(2)$, $P_2(4)$, $P_1(6)$, $P_2(7)$, $P_1(9)$, $P_1(11)$ etc.

Figure 3:
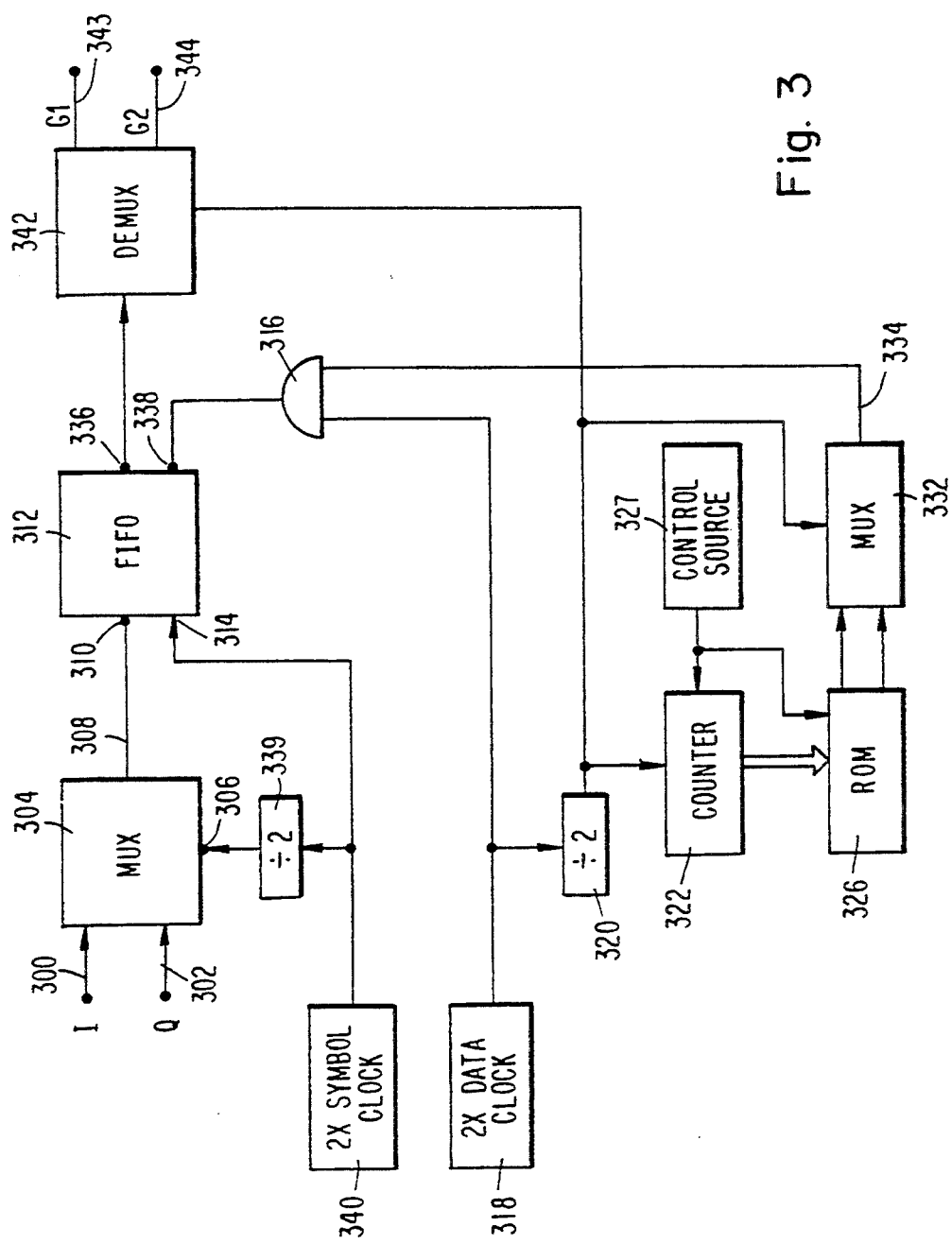
FIG. 3 is a block diagram of a preferred first embodiment of a universal punctured decoder in the receiver of FIG. 1.

Reference is now made to FIG. 3 of the drawing, a block diagram of a preferred embodiment of puncturing decoder 64. The puncturing decoder illustrated in FIG. 3 has an architecture very similar to the architecture of the puncturing coder illustrated in FIG. 2, enabling the puncturing coder and puncturing decoder to be fabricated from the same printed circuit mask, with very slight changes in connections. The puncturing decoder illustrated in FIG. 3 is also universally applicable to all of the optimum punctured codes disclosed by Yasuda et al.

The puncturing decoder illustrated in FIG. 3 includes multiplexer 304, FIFO 312, demultiplexer 342, AND gate 316, counter 322, memory 326 and multiplexer 332, which correspond with corresponding elements 204, 212, 242, 216, 222, 226 and 232 of FIG. 2. Multiplexer 304 responds to the I and Q outputs of demodulator 62, and has an output connected to a data input of FIFO 312 in the same manner as the output of multiplexer 204 is coupled to the data input of FIFO 212. The data output of FIFO 312 is supplied to an input of demultiplexer 242 in the same manner that the data output of FIFO 212 is connected to the input of demultiplexer 342. Demultiplexer 342 derives G1 and G2 bit sequences including dummy bits that are supplied to Viterbi decoder 66. Counter 322, memory 326, multiplexer 332 and AND gate 316 are connected to each other in the same manner that counter 222, memory 226, multiplexer 332 and AND gate 216 are connected to each other.

The puncturing decoder of FIG. 3 also includes square wave clock sources 318 and 340, respectively having frequencies equal to twice the frequency of data sequences G1 and G2 supplied by demultiplexer 342 to leads 343 and 344 and twice the frequency of the I and Q symbols supplied to multiplexer 304 via leads 300 and 302. Clock sources 318 and 340 are synchronized to the received symbols in a manner well known to those skilled in the art, by apparatus not shown. The output of symbol clock 318, at two times the rate of data sequences G1 and G2 is applied to AND gate 316 so that AND gate 316 derives a punctured clock sequence in identically the same manner that AND gate 216 derives a punctured clock sequence. The output of AND gate 316 is supplied to terminal output data clock 338 of FIFO 312; in contrast, the terminal output data clock of FIFO 212 responds to a frequency equal to twice the symbol frequency, as derived from clock source 240. FIFO 312 responds to positive going leading edges at terminal 338 so that the FIFO derives, at terminal 336, a binary bit sequence that is the same as the bit sequence supplied to the FIFO. Demultiplexer 342 includes a control input having a frequency equal to the frequency of data in sequences G1 and G2, as derived from divide by 2 frequency divider 320, in turn responsive to the output of data clock source 318. Thereby, lead 343 is responsive to the binary level at terminal 336 when the output of frequency divider 320 has a binary 1 value and the output at terminal 336 is supplied to lead 344 while the divider output has a binary 0 level. Hence, demultiplexer 342 is switched at twice the frequency of data clock source 318.

The output of clock source 340, at twice the frequency of the I and Q symbols on leads 300 and 302, is supplied to the data clock input terminal 314 of FIFO 312. Control input 306 of multiplexer 304 responds to a divide by two output of clock source 340, as derived from divide by two frequency divider 339, so the I and Q bits on leads 300 and 302 are alternately coupled to data input 310 of FIFO 312 via lead 308 at twice the frequency of the I and Q symbols on leads 300 and 302. Counter 322 and memory 326 respond to signals from control source 327 indicative of which of the optimum codes is being transmitted to the receiver. Control source 327 can be controlled by a signal derived from the transmitter at the time a transmission sequence begins or in other ways.

For the ⅔ punctured code, the sequential I and Q symbols supplied to leads 300 and 302 are respectively represented as:

$$I(0), I(1), I(2), I(3), I(4), I(5), \text{etc.} \quad (5)$$

and $$Q(0), Q(1), Q(2), Q(3), Q(4), Q(5), \text{etc.} \quad (6)$$

Multiplexer 304 responds to the I and Q sequences on leads 300 and 302 to derive on lead 308 a signal in accordance with:

$$I(0), Q(0), I(1), Q(1), I(2), Q(2), I(3), Q(3), I(4), Q(4), I(5), Q(5), \text{etc.} \quad (7)$$

The foregoing sequence of binary bits is loaded into FIFO 312, which responds to the punctured clock derived from AND gate 316 to derive, on lead 336, the sequence:

$$I(0), Q(0), X, I(1), Q(1), I(2), X, Q(2), I(3), Q(3), X, I(4), Q(4), I(5), X, Q(5), \text{etc.}, \quad (8)$$

where X is a "dummy" bit at output 336. Demultiplexer 342 responds to the foregoing sequence at terminal 336 to supply leads 343 and 344 with sequences G1 and G2, respectively, in accordance with:

$$G1 = I(0), X, Q(1), X, I(3), X, Q(4), X, \text{etc.} \quad (9)$$

and $$G2 = Q(0), I(1), I(2), Q(2), Q(3), I(4), I(5), Q(5), \text{etc.} \quad (10).$$

Substitution of the P1 and P2 values supplied to puncturing coder 22 for the values of:

$$I(0), I(1), I(2), I(3), I(4), I(5), \text{etc.}$$

and $$Q(0), Q(1), Q(2), Q(3), Q(4), Q(5), \text{etc.}$$

indicates the output of puncturing decoder 64 is ordered in the same manner as the input to puncturing coder 22, except for the insertion of the dummy bits. The presence of the dummy bits is signalled to Viterbi decoder 66 by the output of multiplexer 332 by a 0 at the output of the multiplexer.

For the 6/7 punctured code, the inputs and output of multiplexer 304 and the data input 310 of FIFO 312 are identical to the previously described situation for the ⅔ punctured code. However, for the 6/7 situation, the output of AND gates 216 and 316 differs from that for the ⅔ rate; the output of AND gates 216 and 316 for the 6/7 punctured code are identical. FIFO 312 responds to the punctured data clock output of AND gate 316 and the signal supplied to it to derive, at terminal 336, a sequence in accordance with:

$$I(0), Q(0), X, I(1), X, Q(1), I(2), X, X, Q(2), X(3), X \quad (11).$$

Demultiplexer 342 responds to the sequence at output 336 of FIFO 312 to derive, on leads 343 and 344, data sequences in accordance with:

$$I(0), X, X, I(2), X, I(3), \text{etc.} \quad (12)$$

and $$Q(0), I(1), Q(1), X, Q(2), X, \text{etc.} \quad (13).$$

The apparatus illustrated in FIG. 3 is for a situation in which demodulator 62 derives a single bit for each I and Q symbol. However, in many situations, demodulator 62 derives a most significant bit indicative of the values of I and Q and one or more additional bits indicative of the confidence levels of the most significant bits for the proper values of I and Q. The additional bits are derived in parallel with the most significant I and Q bits and have corresponding time slots. The additional bits are processed by apparatus similar to that illustrated in FIG. 3, such that for each additional bit a multiplexer, FIFO and demultiplexer are provided. The multiplexer, FIFO and demultiplexer for the additional bits are driven in parallel by the same data clock pulse trains, punctured data clock pulse trains and symbol clock pulse trains which drive multiplexer 304, FIFO 312 and demultiplexer 342. The additional bits are applied to Viterbi decoder 66 and processed by the Viterbi decoder, interleaver 68 and Reed-Solomon decoder 70 in a manner well known to those of ordinary skill in the art.

Figure 4:
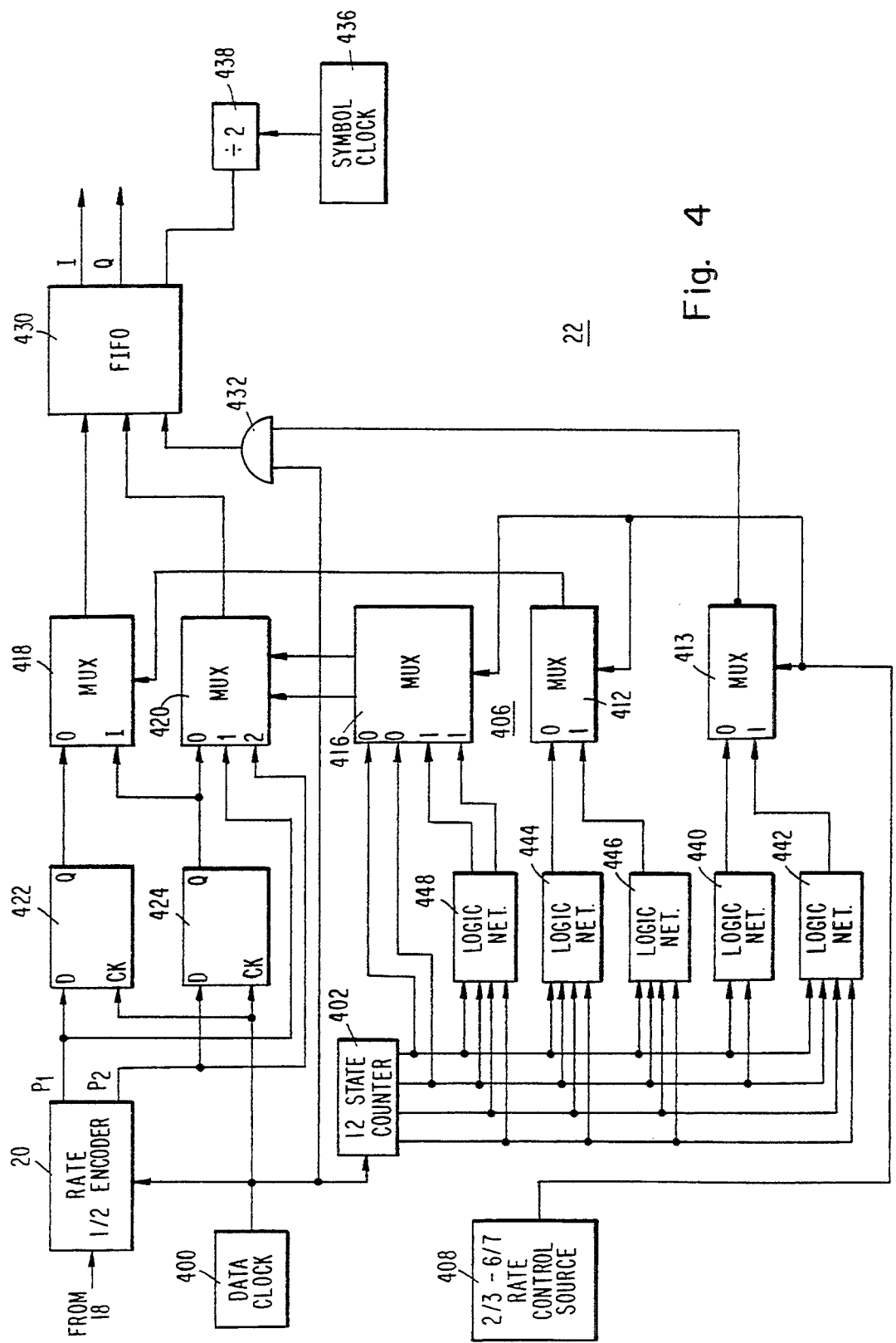
FIG. 4 is a block diagram of a second embodiment of a punctured encoder particularly adapted to handle the ⅔ and 6/7 punctured codes.

Reference is now made to FIG. 4 of the drawing, a block diagram of a second embodiment of puncturing coder 22, specifically designed only for deriving the ⅔ and 6/7 punctured signals in response to the P1 and P2 output signals of rate ½ encoder 20. Signals P1 and P2 derived by encoder 20 are respectively applied to D inputs of D (data) flip-flops 422 and 424, having clock (CK) inputs responsive to square wave data clock source 400, also coupled to encoder 20 to control the rate, i.e. frequency, at which the P1 and P2 signals are read from the encoder. Signals at the Q output terminals of flip-flops 422 and 424 are respectively applied to "0" signal input terminals of two input signal multiplexer 418 and three input signal multiplexer 420. Multiplexer 418 includes a "1" input signal terminal responsive to the signal at the Q output of flip-flop 424, while multiplexer 420 includes a "1" input signal terminal responsive to the P1 output of encoder 20. The P2 output of encoder 20 is coupled to input signal terminal "2" of multiplexer 420. Multiplexer 418 includes a single bi-level (0 and 1) control input terminal, while multiplexer 420 includes two bi-level control input terminals.

Multiplexers 418 and 420 are activated so an output signal is always simultaneously derived from them. The output signals of multiplexers 418 and 420 are applied to parallel signal input terminals of FIFO 430, from which are derived I and Q symbol representing signals. Output signals of FIFO 430 are derived at a rate equal to one-half the frequency of symbol clock source 436 which drives the FIFO output clock terminal via divide by two frequency divider 438. The rate at which bits are coupled to the signal input terminals of FIFO 430 is controlled by AND gate 432, in turn responsive to a logical combination of the output of data clock 400 and a puncture control signal derived from multiplexer 434. The output of gate 432 is applied to the FIFO input clock terminal. The I and Q symbol representing signals derived by FIFO 430 are respectively responsive only to the outputs of multiplexers 418 and 420.

Control of multiplexers 418 and 420 is provided by logic network 406, including multiplexers 412, 416 and 434. AND gate 432 responds to the signal supplied to it by multiplexer 434 and the square wave output of clock 400 to derive a punctured output clock having a predetermined "frequency". The punctured output of gate 432 is a sequence of binary 1 and 0 levels, arranged so certain binary 1 levels are deleted from the square wave output of clock source 400. For rate ⅔, gate 432 responds to the signals supplied to it by multiplexer 434 and a 10101010 sequence from clock source 400 to derive the sequence 10101000. For rate 6/7, gate 432 responds to the signal supplied to it by multiplexer 434 and a 010101010101010101010 sequence from clock source 400 to derive the sequence 1010001000101000100001000. Each of the aforementioned sequences derived from gate 432 is thereafter repeated. Hence, for the output of gate 432 having a "frequency" of $CK_{out}$, the square wave derived from clock source 400 has a frequency $CK_{in}=1.333CK_{out}$ for a ⅔ puncturing rate; for the 6/7 puncturing rate, the frequency, $CK_{in}$, of the square wave derived from clock 00 is 1.71429 $CK_{out}$. To these ends, multiplexer 416 includes two output leads on which are derived four possible binary bit values for control of multiplexer 420; only three of the four values are used. Multiplexer 412 includes a single output lead on which are derived two binary bit levels for controlling the state of multiplexer 418. The output combinations of multiplexer 16 control whether the signal at 0, 1 or 2 signal input terminal of multiplexer 420 is passed to the output of that multiplexer or if the output of the multiplexer 420 is decoupled from the signals at its signal input terminals.

Control of multiplexers 412, 416 and 434 is in response to the binary level derived from rate control source 408. Rate control source 408 derives binary 0 and levels when the ⅔ and 6/7 puncture rates are respectively selected. The binary output of source 408 is applied in parallel to control input terminals of multiplexers 412, 416 and 434. In response to the binary 0 and 1 levels of source 408, the inputs at the "0" and "1" signal input terminals of multiplexers 412, 416 and 434 are respectively coupled to the signal output terminal of each multiplexer.

Signals applied to the 0 and 1 signal input terminals of multiplexers 412, 416 and 434 are derived by applying the output of data clock 400 to 12 state counter 402, having a count ranging from 0 to 11 and a four bit output bus. The two least significant output bits of counter 402 are supplied to logic network 440, which derives a binary 1 level in response to these bits having a value indicative of the numerics 0, 1 or 2, (binary values 00, 01, 10), and a binary 0 level in response to the two least significant bits having a numeric value of 3 (binary value 11). The output of logic network 440 is applied to the 0 signal input terminal of multiplexer 434. All four binary output bits of counter 402 are supplied to logic network 442, which derives a binary 1 value in response to the counter output representing any of the numerics 0, 1, 3, 5, 6, 8 or 10; logic circuit 442 derives a binary 0 value in response to the four bits derived from counter 402 representing any of the numerics 2, 4, 7, 9 or 11. The binary level derived from logic network 442 is applied to the "1" input signal terminal of multiplexer 434. The resulting output of multiplexer 434 is applied to AND gate 432 to control the coupling of data bits from multiplexers 418 and 420 into FIFO 430.

The 0 and 1 signal input terminals of multiplexer 412 respectively respond to outputs of logic networks 444 and 446, both in turn responsive to the four-bit output of counter 402. Network 444 derives a binary 1 output in response to the output bits of counter 402 representing any of the numerics 1–3, 5–7 or 9–11; logic network 444 derives a binary 0 output in response to the four-bit output of counter 402 representing any of the numerics 0, 4 and 8. Logic network 446 responds to the four-bit output of counter 402 to derive a binary 1 level in response to the output of the counter representing any of the numerics 1, 2, 4 or 6–11. A binary 0 level is derived from logic network 446 in response to the count of counter 402 representing any of the numbers 0, 3 or 5.

Multiplexer 416 includes one control input terminal, first and second output terminals and four signal input terminals, designated as first and second "0" signal input terminals and first and second "1" signal input terminals. In response to a binary zero being applied to the control input terminal the binary levels at the first and second "0" signal input terminals are respectively coupled to the multiplexer first and second output terminals; in response to a binary one being at the control input terminals the levels at the first and second "1" signal terminals are respectively coupled to the multiplexer first and second output terminals.

The most and next most least significant output bits of counter 402, representing the numerics 0–3, are respectively applied to the first and second 0 signal input terminals of multiplexer 416 and coupled to the multiplexer first and second output terminals, thence to the control inputs of multiplexer 420, in response to a binary 0 output of source 408 being applied to the control input of multiplexer 416. The first and second 1 input signal terminals of multiplexer 416 are respectively responsive to first and second output bits of logic network 448, in turn responsive to all four output bits of counter 402. In response to the count of counter 402 representing the numeric 0, logic network 448 supplies a binary 0 level to each of the first and second 1 signal input terminals of multiplexer 416. In response to counter 402 deriving a signal representing the numerics 5, 8 and 10, a binary 1 signal is applied by network 448 to the first "1" signal input terminal of multiplexer 416, while a 0 level is applied to the second "1" signal input terminal of the multiplexer. For all other numeric values for the outputs of counter 402, a binary 0 level is supplied by logic network 448 to the first "1" input terminal of multiplexer 416 while a binary 1 level is supplied to the second 1 input terminal of multiplexer 416. Hence, in response to control source 408 deriving a binary 1 level while counter 402 is deriving the binary sequence 0000, multiplexer 416 supplies signal bits 00 to the control input of multiplexer 420 to couple the signal at the Q output of flip-flop 424 to the output of multiplexer 420. While source 408 derives a binary 1 level and counter 402 derives a binary signal associated with the numerics 5, 8 and 10, multiplexer 416 supplies signal levels 1 and 0 to the control inputs of multiplexer 420, causing the P1 output of encoder 20 to be coupled to the output of multiplexer 420. In response to source 408 deriving a binary 1 level while counter 402 derives a binary signal associated with the numerics 1, 2, 3, 4, 6, 7, 9 and 11, multiplexer 416 supplies multiplexer 420 with signal bits 0 and 1, causing multiplexer 420 to supply the P2 output of encoder 20 to the signal input terminal of FIFO 430.

The I and Q channel signals derived from FIFO 430 have sequences identical to the sequences derived from demultiplexer 242 for the ⅔ and 6/7 puncturing rates. The circuitry of FIG. 4 processes the P1 and P2 sequences derived from encoder 20 on a parallel basis. The parallel sequences are punctured by FIFO 432 that derives the parallel I and Q channels. The circuitry of FIG. 4 does not include a ROM and its associated control circuitry as is required by the circuitry illustrated in FIG. 2. However, the circuitry of FIG. 4 does not have the advantage of being universally applicable to all of the optimum puncturing rates disclosed by Yasuda et al.

Figure 5:
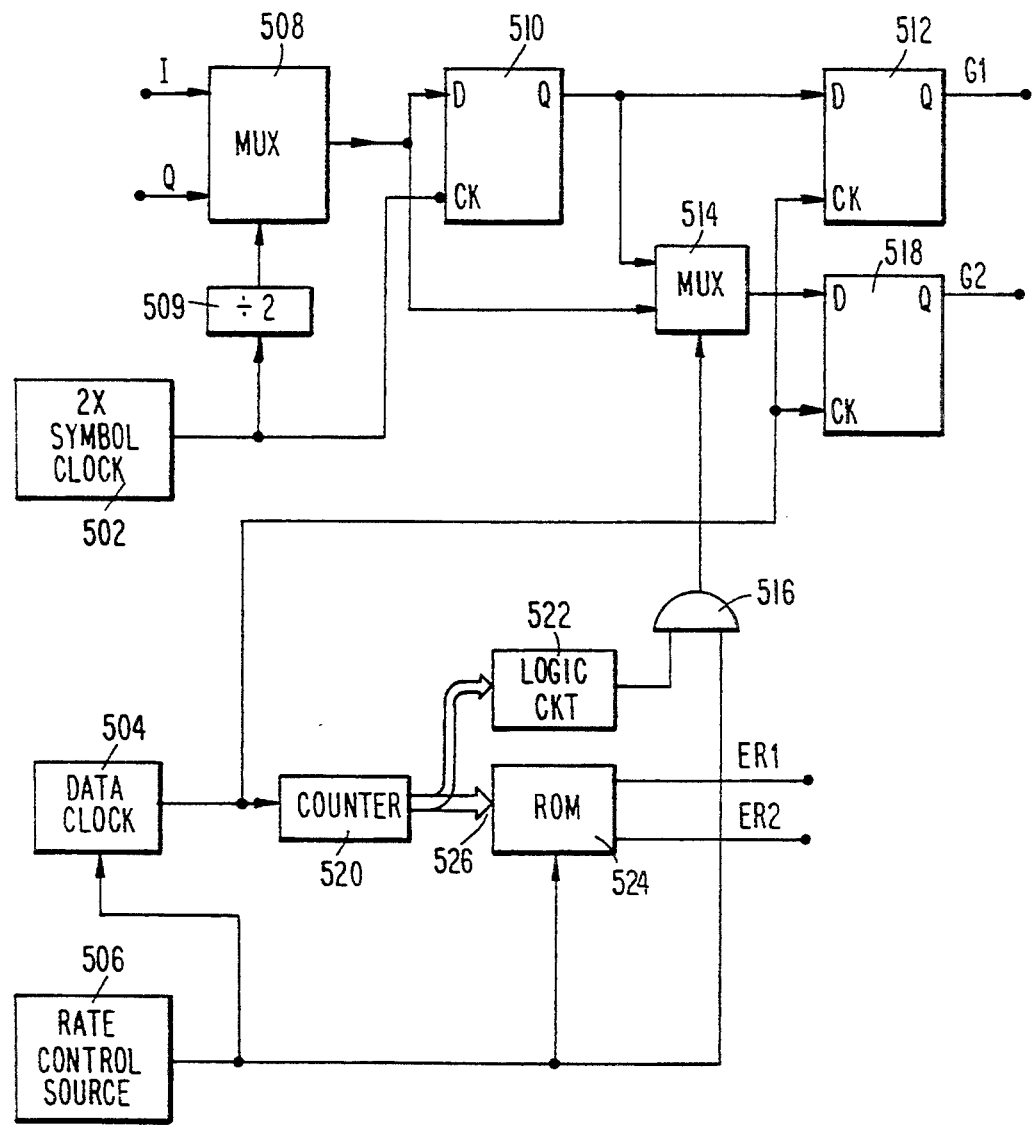
FIG. 5 is a block diagram of a second embodiment of a punctured decoder, particularly adapted to handle the ⅔ and 6/7 punctured codes.

Reference is now made to FIG. 5 of the drawing, a block diagram of a second embodiment of puncturing decoder 64, particularly applicable to the ⅔ and 6/7 punctured codes. The apparatus illustrated in FIG. 5 is responsive to the I and Q outputs of demodulator 62 and includes square wave symbol clock source 502, having a frequency equal to twice the frequency of the symbols derived by demodulator 62, and rectangular wave data clock source 504. Conventional synchronizing apparatus, not shown, synchronizes symbol and data clock sources 502 and 504 to the I and Q symbols derived from demodulator 62. The apparatus illustrated in FIG. 5 also includes control source 506, selectively having 0 and 1 values respectively indicative of the ⅔ and 6/7 punctured codes. The output of source 506 controls the bit sequences of sources 502 and 504. Since symbol clock source 502 is a square wave the sequence derived thereby is 101010101010 etc. for both punctured codes; for the ⅔ punctured code, the output of data clock source 504 is the repeating punctured sequence 100010100010 etc.; for the 6/7 punctured code the data clock repeating punctured sequence is 10101010101000 etc. The period of every binary zero and one value in the foregoing sequences is the same, e.g., 12.5 nanoseconds.

The apparatus illustrated in FIG. 5 derives the G1 and G2 sequences that are supplied to Viterbi decoder 66, as well as signals ER1 and ER2 having binary 1 values when the bits of G1 and G2 have values that ideally correspond with the values of sequences P1 and P2; signals ER1 and ER2 have binary 0 levels when there is no predictable correspondence between the bit values of G1 and G2 and P1 and P2, i.e., when G1 and G2 are dummy bits. Bit sequences G1, G2, ER1 and ER2 do not have equal length for every received symbol. For the ⅔ punctured code, the length of every third bit in sequences G1, G2, ER1 and ER2 is twice as long as the remaining bits and occupies two periods of the output of clock source 502. For the 6/7 punctured code, every seventh bit in sequences G1, G2, ER1 and ER2 is twice as long as the remaining bits of these sequences and occupies two periods of clock source 502.

To these ends, sequential I and Q output bits of demodulator 62, i.e. I(0), I(1), I(2) etc. and Q(0), Q(1), Q(2) etc., are supplied to multiplexer 508, which is switched at twice the frequency of the I and Q symbols in response to sequential binary 1 and 0 levels derived from divide by two frequency divider 509, in turn responsive to the output of symbol clock source 502. Multiplexer 508 responds to the output of divider 509 in the same manner that multiplexer 304 responds to the I and Q outputs of demodulator 62, causing the output of multiplexer 508 to be the bit sequence I(0), Q(0), I(1), Q(1), I(2), Q(2) etc.

The bit sequence derived by multiplexer 508 is applied to the D input of D flip-flop 510, having a clock input responsive to the square wave output of clock source 502 and a Q output, coupled to multiplexer 514 and the D input of D flip-flop 512, having a clock input responsive to the rectangular wave output of data clock 504. Flip-flop 512 includes a Q output responsive to the binary sequences applied to the D and clock inputs of the flip-flop and on which is derived sequence G1. Since the data clock input of flip-flop 512 from source 504 is punctured there is no change in the flip-flop output with every change in the I and Q bits applied to multiplexer 508. Hence, for the ⅔ punctured code, the output of flip-flop 512 is the sequence I(0), Q(0), Q(0), Q(1), I(2), I(2),, I(3), Q(3), Q(3) etc.; for the 6/7 punctured code, the output of flip-flop 512 is the sequence I(0), Q(0), I(1), I(2), Q(2), I(3), Q(3). For the ⅔ punctured code, dummy bit indicating circuitry described infra signals that the values of bits Q(0), I(2), Q(3) at the output of flip-flop G1 are to be ignored by decoder 66 because they are dummy bits. For the 6/7 punctured code, the dummy bit indicating circuitry signals that the Q(0), I(1), Q(3) bits are to be ignored as dummy bits.

To derive sequence G2, the outputs of multiplexer 508 and the Q output of flip-flop 510 are supplied to multiplexer 514, having a control input responsive to the output of AND gate 516. One input of AND gate 516 is responsive to the output of control source 506, to disable AND gate 516 in response to control source 506 deriving a binary 0 level associated with a ⅔ punctured code. A binary 0 level is thus always applied to the control input of multiplexer 514 while the ⅔ punctured code is selected, causing the output of multiplexer 508 to be coupled to the D input of D flip-flop 518, having a clock input connected to the output of data clock source 504 and a Q output on which is derived bit sequence G2. For the ⅔ punctured code, the output of flip-flop 518 is represented by the sequence Q(0), I(1), I(1), I(2), Q(2), Q(2), Q(3), I(4) etc. There is no dummy bit in this sequence. The second values of I(1), Q(2) are read and interpreted as data bits by decoder 66 and the circuitry driven by the decoder.

For the 6/7 punctured code, one input of AND gate 516 is responsive to the binary 1 output of control source 506 and a binary 1 signal is supplied to the other input of AND gate 516 once in response to every six binary one outputs of data clock source 504. To these ends, the output of data clock source 504 is applied to counter 520, having six states, sequentially associated with 000, 001, 010, 011, 100, 101. The resulting three bit output of counter 520 is applied to logic circuit 522, which derives a binary 1 level in response to the output of counter 520 having a value of 011. Multiplexer 514 responds to the binary 1 output of AND gate 516 to couple the binary level at the Q output of flip-flop 510 to the D input of flip-flop 518, to the exclusion of the output of multiplexer 508. For all other situations, the output of multiplexer 508 is coupled via multiplexer 514 to the D input of flip-flop 518. The resulting G2 sequence at the Q output of flip-flop 518 is thus Q(0), I(1), Q(1), Q(1), Q(2), Q(2), Q(3), I(4). The dummy bit indicating circuitry signals that the first occurrence of Q(2) and that Q(3) in this sequence are dummy bits.

The circuitry for indicating dummy bits in bit sequences G1 and G2 includes read only memory 524. Memory 524 includes a control input responsive to the output of control source 506, so that the puncturing codes associated with the ⅔ and 6/7 punctured codes are respectively selected in response to the output of control source 506 having binary 0 and 1 levels.

Read only memory 524 also includes multibit address input 526, responsive to the three bit output of counter 520. Memory 524 includes a pair of single bit outputs ER1 and ER2 on which are derived binary 1 and 0 levels indicative of whether the binary levels in sequences G1 and G2, as derived from the Q outputs of flip-flops 512 and 518, respectively, are true or dummy bits. Memory 524 is programmed so that in response to a binary 0 at the output of control source 506, the bit sequences at the ER1 and ER2 outputs of the memory are respectively 101010 and 111111 in response to the six sequential output counts of counter 520. In response to a binary 1 output of control source 506, memory 524 responds to the six sequential output counts of counter 520 to derive the values of ER1 and ER2 in accordance with 100101 and 111010, respectively. The binary 0 levels derived from memory 524 are coupled to Viterbi decoder 66 to signal which of the bits in bit sequences G1 and G2 are dummy bits.

The apparatus illustrated in FIG. 5 can also be used for the situation wherein each of the I and Q outputs of demodulator 62 is a multibit, parallel signal. In such a case, each of the additional I and Q bits is coupled to circuitry identical to multiplexer 508, flip-flops 510, 512 and 518, as well as multiplexer 514. The control inputs of the multiplexers for the additional bits corresponding to multiplexers 508 and 514 are identical to those illustrated in FIG. 5. The clock inputs of the flip-flops for the additional bits corresponding to flip-flops 510, 512 and 518 are identical to those illustrated in FIG. 5.

While there have been described and illustrated multiple specific embodiments of the invention, it will be clear that variations in the details of the embodiments specifically illustrated and described may be made without departing from the true spirit and scope of the invention as defined in the appended claims.

We claim:

1. A method of communicating a digital data signal from a transmitter to a receiver during mutually exclusive transmitting periods comprising encoding the digital data signal into a ½ rate convolutional encoded signal during each of said periods; during the first transmission period (1) encoding the convolutional encoded signal into a first forward error correction convolutional encoded signal having a ⅔ punctured code and (2) transmitting the encoded first forward error correction signal to the receiver via a geosynchronous satellite; during the second transmission period (1) encoding the convolutional encoded signal into a second forward error correction convolutional encoded signal having a 6/7 punctured code and (2) transmitting the encoded second forward error correction signal to the receiver via the geosynchronous satellite; controlling the power emitted from the satellite so the power emitted from the satellite of the encoded forward error correction signal having the ⅔ punctured code during the first period is appreciably lower than the power emitted from the satellite of the encoded forward error correction signal having the 6/7 punctured code during the second period; during both the first and second periods receiving the encoded forward error correction signals emitted from the satellite at the receiver with an antenna including a dish having a diameter no greater than about 1 meter, and decoding the received encoded forward error correction signals into a further signal that is an approximate replica of the digital data signal.

2. The method of claim 1 further including deriving the digital data signal from a television program signal.

3. The method of claim 2 including converting the further signal into a signal for a household television receiver.

4. The method of claim 1 wherein the power of the signal emitted from the satellite during the first interval is about 3 db lower than the power emitted from the satellite during the second interval.

5. A receiver for digital data signals encoded into a pair of ½ rate convolutional encoded signals, the ½ rate convolutional encoded signals being encoded at mutually exclusive times into first and second forward error correction convolutional coded data signals respectively having punctured codes of ⅔ and 6/7, data in only one of said coded signals being coupled to the receiver at a time, comprising an antenna including a dish having a diameter no greater than about one meter, first circuit means responsive to a signal transduced by the antenna for deriving a first received signal containing substantially the same data as in (1) the forward error correction convolutional coded signal having the ⅔ punctured code while the data in the first signal is being received by the receiver and (2) the forward error correction convolutional coded signal having the 6/7 punctured code while the data in the second signal is being received by the receiver, and means responsive to the signal derived by the circuit means for deriving a third signal that is an approximate replica of the digital data signal.

6. The receiver of claim 5 wherein the digital data signal is derived from a television program signal and the receiver further includes means for converting the third signal into a signal for a household television receiver.

7. The receiver of claim 5 wherein the forward error correction convolutional encoded signal having the $\frac{2}{3}$ punctured code includes I and Q parallel channels having sequential bits $P_1(0)$, $P_2(1)$, $P_2(2)$, $P_1(4)$ and $P_2(0)$, $P_1(2)$, $P_2(3)$, $P_2(4)$ respectively in corresponding time slots $t_k$, $t_{k+1}$, $t_{k+2}$, $t_{k+3}$, the circuit means responding to the bits of the I and Q channels for (a) forming first and second parallel sequential bit streams such that the sequential bits of the first bit stream in time slots $t_k$, $t_{k+1}$, $t_{k+2}$, $t_{k+3}$ are respectively $P_1(0)$, $X_1$, $P_1(2)$, $X_2$ (where $X_1$ and $X_2$ are dummy bits) and the sequential bits of the second bit stream in the corresponding time slots $t_k$, $t_{k+1}$, $t_{k+2}$, $t_{k+3}$ are respectively $P_2(0)$, $P_2(1)$, $P_2(2)$, $P_2(3)$, and (b) signalling that bits $X_1$ and $X_2$ of the first bit stream are dummy bits.

8. The receiver of claim 7 wherein the circuit means for forming the first and second parallel sequential bit steams includes means for coupling the sequential bits of the I and Q channels into a serial bit stream having sequential bits $P_1(0)$, $P_2(0)$, $P_2(1)$, $P_1(2)$, $P_2(2)$, $P_2(3)$, $P_1(4)$, $P_2(4)$.

9. The receiver of claim 5 wherein the forward error correction convolutional encoded signal punctured at the rate 6/7 includes I and Q parallel channels having sequential bits $P_1(0)$, $P_2(1)$, $P_1(3)$, $P_1(5)$, $P_2(6)$, $P_2(8)$, $P_2(10)$, and $P_2(0)$, $P_2(2)$, $P_2(4)$, $P_1(6)$, $P_2(7)$, $P_1(9)$, $P_1(11)$ respectively in corresponding time slots $t_k$, $t_{k+1}$, $t_{k+2}$, $t_{k+3}$, $t_{k+4}$, $T_{k+5}$, $T_{k+6}$, the circuit means responding to the bits of the I and Q channels for (a) time slots $t_{k+1}$, $t_{k+2}$, $t_{k+3}$, $t_{k+4}$, $t_{k+5}$, $T_{k+6}$, $t_{k+7}$, forming first and second parallel sequential bit streams such that the sequential bits of the first bit stream in $t_{k+8}$, $t_{k+9}$, $t_{k+10}$, $t_{k+11}$, $t_{k+12}$ are respectively $P_1(0)$, $X_3$, $X_4$, $P_1(3)$, $X_5$, $P_1(5)$, $P_1(6)$, $X_6$, $X_7$, $P_1(9)$, $X_8$, $P_1(11)$ and the sequential bits of the second bit stream in the corresponding time slots $t_{k+1}$, $t_{k+2}$, $t_{k+3}$, $t_{k+4}$, $t_{k+5}$, $T_{k+6}$, $t_{k+7}$, $t_{k+8}$, $t_{k+9}$, $t_{k+10}$, $t_{k+11}$, $t_{k+12}$ are respectively $P_2(0)$, $P_2(1)$, $P_2(2)$, $X_9$, $P_2(4)$, $X_{10}$, $P_2(6)$, $P_2(7)$, $P_2(8)$, $X_{11}$, $P_2(10)$, $X_{12}$ (where $X_3$-$X_{12}$ are dummy bits, and (b) signalling that the bits in time slots $t_{k+2}$, $t_{k+3}$, $T_{k+5}$, $t_{k+8}$, $t_{k+9}$, $t_{k+11}$ of the first bit stream and that the bits in time slots $t_{k+4}$, $T_{k+6}$, $t_{k+10}$, $t_{k+12}$ of the second bit stream are dummy bits.

10. The receiver of claim 9 wherein the circuit means for forming the first and second parallel sequential bit streams includes means for coupling the sequential bits of the I and Q channels into a serial bit stream having sequential bits $P_1(0)$, $P_2(0)$, $P_2(1)$, $P_2(2)$, $P_1(3)$, $P_2(4)$, $P_1(5)$, $P_1(6)$, $P_2(6)$, $P_2(7)$, $P_2(8)$, $P_1(9)$, $P_2(10)$, $P_1(11)$.

11. The receiver of claim 10 wherein the forward error correction convolutional encoded signal punctured at the rate $\frac{2}{3}$ includes I and Q parallel channels having sequential bits $R_1(0)$, $R_2(1)$, $R_2(2)$, $R_1(4)$ and $R_2(0)$, $R_1(2)$, $R_2(3)$, $R_2(4)$ respectively in corresponding time slots $t_j$, $t_{j+1}$, $t_{j+2}$, $t_{j+3}$, the circuit means responding to the bits of the I and Q channels for (a) forming third and fourth parallel sequential bit streams such that the sequential bits of the third bit stream in time slots $t_j$, $t_{j+1}$, $t_{j+2}$, $t_{+3}$ are respectively $R_1(0)$, $X_1$, $R_1(2)$, $X_2$ (where $X_1$ and $X_2$ are dummy bits), and the sequential bits of the fourth bit stream in the corresponding time slots $t_j$, $t_{j+1}$, $t_{j+2}$, $t_{j+3}$ are respectively $R_2(0)$, $R_2(1)$, $R_2(2)$, $R_2(3)$, and (b) signalling that bits $X_1$ and $X_2$ of the third bit stream are dummy bits.

12. The receiver of claim 11 wherein the circuit means for forming the third and fourth parallel sequential bit streams includes means for coupling the sequential bits of the I and Q channels into a serial bit stream having sequential bits $R_1(0)$, $R_2(0)$, $R_2(1)$, $R_1(2)$, $R_2(2)$, $R_2(3)$, $R_1(4)$, $R_2(4)$.

13. The receiver of claim 9 wherein the forward error correction convolutional encoded signal punctured at the rate $\frac{2}{3}$ includes I and Q parallel channels having sequential bits $R_1(0)$, $R_2(1)$, $R_2(2)$, $R_1(4)$ and $R_2(0)$, $R_1(2)$, $R_2(3)$, $R_2(4)$ respectively in corresponding time slots $t_j$, $t_{j+1}$, $t_{j+2}$, $t_{j+3}$, the circuit means responding to the bits of the I and Q channels for (a) deriving third and fourth parallel sequential bit streams such that the sequential bits of the third bit stream in time slots $t_j$, $t_{j+1}$, $t_{j+2}$, $t_{j+3}$ are respectively $R_1(0)$, $X_1$, $R_1(2)$, $X_2$ (where $X_1$ and $X_2$ are dummy bits) and the sequential bits of the fourth bit stream in the corresponding time slots $t_j$, $t_{j+1}$, $t_{j+2}$, $t_{j+3}$ are respectively $R_2(0)$, $R_2(1)$, $R_2(2)$, $R_2(3)$, and (b) signalling that bits $X_1$ and $X_2$ of the third bit stream are dummy bits.

14. A forward error correction method wherein a transmitter responds to an intelligence signal and a receiver derives an output determined by a representation of the intelligence as received at the receiver, the method comprising:

at the transmitter:

encoding input bits representing the intelligence signal into first and second parallel different sequential bit streams such that a plurality of the input bits is converted into multiple bits of each of the first and second parallel bit streams, the first and second parallel bit streams having corresponding sequential time slots 1, 2 ... $(j_1-1)$, $j_1$, $(j_1+1)$ ... $(j_2-1)$, $j_2$, $(j_2+1)$ ... $j_3$. ... M so there is in each time slot a bit of each bit stream;

combining and puncturing the first and second parallel bit streams into a serial punctured bit stream having time slots 1, 2 ... $(k_1-1)$, $k_1$, $(k_1+1)$ $(k_1+2)$ ... $(k_2-1)$, $k_2$, $(k_2+1)$ ... N, so that:

(a) for the time slot $j_1$ of the first and second bit streams, having no undeleted bits, (i) time slots $k_1$ and $(k_1+1)$ respectively have therein the bits in time slot $j_1$ of the first and second bit streams, (ii) time slot $(k_1-1)$ has a bit therein resulting from a bit in time slot $(j_1-1)$ of the first and second bit streams provided time slot $(j_1-1)$ of the first and second bit streams has at least one undeleted bit, and (iii) time slot $(k_1+2)$ has a bit therein resulting from a bit in time slot $(j_1+1)$ of the first and second bit streams provided time slot $(j_1+1)$ of the first and second bit streams has at least one undeleted bit; (b) for the time slot $j_2$ of the first and second bit streams having one undeleted bit and one deleted bit, (i) time slot $k_2$ has the undeleted bit, (ii) time slot $(k_2-1)$ has a bit therein resulting from a bit in time slot $(j_2-1)$ of the first and second bit streams provided time slot $(j_2-1)$ of the first and second bit streams has at least one undeleted bit, time slot $(k_2+1)$ has a bit therein resulting from a bit in time slot ($j_{2+1}$) of the first and second bit streams provided time slot ($j_{2+1}$) of the first and second bit streams has at least one undeleted bit; and (c) for the time slot $j_3$ of the first and second bit streams having only deleted bits there is no time slot in the serial deleted bit stream; and responding to the serial stream to derive plural parallel punctured bit streams including the bits of the serial bit stream;

modulating a carrier in response to bits of the plural parallel punctured bit streams so that the carrier is simultaneously modulated by the plural parallel bit streams;

transmitting the modulated carrier to the receiver;

at the receiver:

receiving the modulated carrier;

converting the received modulated carrier into third and fourth parallel bit streams similar to the plural parallel bit streams; and decoding the third and fourth bit streams into a signal similar to the intelligence signal.

15. The method of claim 14 wherein the carrier is phase shift key modulated in response to the plural parallel punctured bit streams.

16. Apparatus for use in a receiver in a transmission system having forward error correction with punctured convolutional encoded bit streams comprising means responsive to a signal received by the receiver for deriving a first serial punctured bit stream having a first bit rate and similar to a serial punctured bit stream at a transmitter to which the receiver is responsive, a first in first out register having a clock input terminal, a clock output terminal, a data input and a data output, the data input having the same variations as the first serial punctured bit stream, another convolutional encoded serial bit stream having a second data bit rate being derived at the output, clock means for deriving a channel bit clock wavetrain and a punctured clock wavetrain, the clock input terminal being responsive to the channel bit clock wavetrain, and a circuit responsive to the punctured clock wavetrain for deriving a punctured clock wavetrain that is applied to the clock output terminal.

17. The apparatus of claim 16 wherein the receiver is responsive to a modulated wave including first and second channels, the means for deriving the first serial punctured bit stream responding to the wave to derive a pair of parallel bit streams containing the channel bits of the first and second channels, and means for combining the pair of parallel bit streams containing the channel bits of the modulated wave to derive the first serial punctured bit stream.

18. The apparatus of claim 17 wherein the first channel includes sequential bits I(0), I(1), I(2) etc. and the second channel includes sequential bits Q(0), Q(1), Q(2) etc., the first serial punctured bit stream including the bit sequence I(0), Q(0), I(1), Q(1), I(2), Q(2) etc., the first in first out register data output including dummy bits between some adjacent pairs of said bits from the first and second channels so that the data output sequence includes I(j), X, Q(k)

where I(j) is a bit in the first channel

Q(k) is a bit in the second channel supplied to the data input immediately after I(j), and X is a dummy bit inserted into the punctured bit stream by the register.

19. The apparatus of claim 18 further including a serial to parallel converter responsive to the I(j), X, Q(k) data output sequence for sequentially supplying bits I(j) and Q(k) to a first output terminal and for supplying bit X to a second output terminal.

20. The apparatus of claim 16 further including a convolutional decoder having first and second inputs, a serial to parallel converter responsive to the another convolutional encoded serial bit stream for deriving first and second parallel bit streams that are respectively applied to the first and second inputs of the decoder, the decoder responding to the first and second parallel bit streams to derive a serial signal similar to a serial signal at the transmitter which resulted in derivation of the serial punctured bit stream at the transmitter.

21. A forward error correction transmitting method wherein a transmitter responds to an intelligence signal, the method comprising encoding input bits representing the intelligence bits into a pair of convolutional encoded bit streams respectively including sequential bits $P_1(0)$, $P_1(1)$, $P_1(2)$, $P_1(3)$, $P_1(4)$ and $P_2(0)$, $P_2(1)$, $P_2(2)$, $P_2(3)$, $P_2(4)$;

puncturing the convolutional encoded bit streams at a ⅔ code rate to derive first and second parallel rate-⅔ punctured bit streams respectively including sequential bits $P_1(0)$, $P_2(1)$, $P_2(2)$, $P_1(4)$ and $P_2(0)$, $P_1(2)$, $P_2(3)$, $P_2(4)$; and modulating a carrier in response to the punctured bit streams so that at time $t_1$ the carrier is modulated by $P_1(0)$ and $P_2(0)$, at time $t_2$ the carrier is modulated by $P_2(1)$ and $P_1(2)$, at time $t_3$ the carrier is modulated by $P_2(2)$ and $P_2(3)$, and at time $t_4$ the carrier is modulated by $P_1(4)$ and $P_2(4)$.

22. A forward error correction transmitting method wherein a transmitter responds to an intelligence signal, the method comprising encoding input bits representing the intelligence bits into a pair of convolutional encoded bit streams respectively including sequential bits $P_1(0)$, $P_1(1)$, $P_1(2)$, $P_1(3)$, $P_1(4)$, $P_1(5)$, $P_1(6)$, $P_1(7)$, $P_1(8)$, $P_1(9)$, $P_1(10)$, $P_1(11)$ and $P_2(0)$, $P_2(1)$, $P_2(2)$, $P_2(3)$, $P_2(4)$, $P_2(5)$, $P_2(6)$, $P_2(7)$, $P_2(8)$, $P_2(9)$, $P_2(10)$, $P_2(11)$;

puncturing the convolutional encoded bit streams at a 6/7 code rate to derive first and second parallel rate 6/7 punctured bit streams so the first punctured bit stream includes sequential bits $P_1(0)$, $P_2(1)$, $P_1(3)$, $P_1(5)$, $P_2(6)$, $P_2(8)$, $P_2(10)$ and the second punctured bit stream includes sequential bits $P_2(0)$, $P_2(2)$, $P_2(4)$, $P_1(6)$, $P_2(7)$, $P_1(9)$, $P_1(11)$; and modulating a carrier in response to the first and second parallel punctured bit streams so that at time $t_1$ the carrier is simultaneously modulated by $P_1(0)$ and $P_2(0)$, at time $t_2$ the carrier is simultaneously modulated by $P_2(1)$ and $P_2(2)$, at time $t_3$ the carrier is simultaneously modulated by $P_1(3)$ and $P_2(4)$, at time $t_4$ the carrier is simultaneously modulated by $P_1(5)$ and $P_1(6)$, at time $t_5$ the carrier is simultaneously modulated by $P_2(6)$ and $P_2(7)$, at time $t_6$ the carrier is simultaneously modulated by $P_2(8)$ and $P_1(9)$, and at time $t_7$ the carrier is simultaneously modulated by $P_2(10)$ and $P_1(11)$.

23. In a forward error correction receiver responsive to a signal containing I and Q channels including punctured convolutional encoded bits having a data rate, a punctured code and a puncturing pattern, the receiver comprising means responsive to the I and Q channels for combining the bits thereof into a single serial signal such that the I and Q channel bits in time slot $t_k$ are respectively consecutive bits $b_j$ and $b_{j+1}$ of the single serial signal, where $t_k$ is each of plural consecutive time slots $t_1, t_2 \ldots t_N$, a data clock for deriving clock pulses having a puncturing rate corresponding with the puncturing rate of the I and Q channels, means responsive to the serial signal and the clock pulses of the data clock for deriving first and second parallel output bit streams each including sequential time slots containing bits from both the I and Q channels, and means responsive to clock pulses of the data clock for deriving third and fourth parallel bit streams respectively including bits for indicating presence of dummy bits in the first and second parallel bit streams, the bits of the first and third parallel output bit streams in corresponding time slots being such that the bits of the third output bit stream indicate a dummy bit is in the first output bit stream, the remaining bits in the first output bit stream being bits only from the I channel, the bits of the second and fourth parallel output bit streams in corresponding time slots being such that the bits of the fourth output bit stream indicate a dummy bit is in the second output bit stream, the remaining bits in the second output bit stream being bits only from the Q channel.

24. The receiver of claim 23 wherein the receiver is capable of responding to I and Q channels having ⅔ and 6/7 punctured codes at different times.

25. The receiver of claim 23 wherein the means for deriving the third and fourth output bit streams includes a memory for storing the binary bits corresponding to the puncturing patterns, the memory being addressed in response to the clock pulses of the data clock.

26. The forward error correction receiver of claim 23 wherein the means responsive to the serial signal and the clock pulses of the data clock derives the first and second parallel output streams by supplying consecutive bits $b_j$ and $b_{j+1}$ of the serial signal to the first and second output streams, respectively, unless a clock pulse of the data clock signifies a dummy bit is to be inserted in the first output bit stream before serial bit $b_i$, in which case bit $b_i$ is inserted in the second output bit stream unless the data clock signifies a data bit is to be inserted into the second output bit stream.

27. In a method of receiving a forward error correction convolutional encoded signal punctured at a rate ⅔ including I and Q parallel channels having sequential bits $P_1(0)$, $P_2(1)$, $P_2(2)$, $P_1(4)$ and $P_2(0)$, $P_1(2)$, $P_2(3)$, $P_2(4)$, respectively, in corresponding time slots $t_k$, $t_{k+1}$, $t_{k+2}$, $t_{k+3}$ comprising the steps of responding to the bits of the I and Q channels to derive first and second parallel sequential bit streams such that the sequential bits of the first bit stream in time slots $t_k$, $t_{k+1}$, $t_{k+2}$, $t_{k+3}$ are respectively $P_1(0)$, $X_1$, $P_1(2)$, $X_2$, where $X_1$ and $X_2$ are dummy bits and the sequential bits of the second bit stream in the corresponding time slots $t_k$, $t_{k+1}$, $t_{k+2}$, $t_{k+3}$ are respectively $P_2(0)$, $P_2(1)$, $P_2(2)$, $P_2(3)$, and signalling that bits $X_1$ and $X_2$ of the first bit stream are dummy bits.

28. The method of claim 27 further including forming the first and second parallel sequential bit streams by coupling the sequential bits of the I and Q channels into a serial bit stream having sequential bits $P_1(0)$, $P_2(0)$, $P_2(1)$, $P_1(2)$, $P_2(2)$, $P_2(3)$, $P_1(4)$, $P_2(4)$.

29. In a method of receiving a forward error correction convolutional encoded signal punctured at a rate 6/7 including I and Q parallel channels having sequential bits $P_1(0)$, $P_2(1)$, $P_1(3)$, $P_1(5)$, $P_2(6)$, $P_2(8)$, $P_2(10)$, and $P_2(0)$, $P_2(2)$, $P_2(4)$, $P_1(6)$, $P_2(7)$, $P_1(9)$, $P_1(11)$, respectively, in corresponding time slots $t_k$, $t_{k+1}$, $t_{k+2}$, $t_{k+3}$, $t_{k+4}$, $t_{k+5}$, $T_{k+6}$, comprising the steps of responding to the bits of the I and Q channels to derive first and second parallel sequential bit streams such that the sequential bits of the first bit stream in time slots $t_{k+1}$, $t_{k+2}$, $t_{k+3}$, $t_{k+4}$, $T_{k+5}$, $t_{k+6} t_{k+7}$, $t_{k+8}$, $t_{k+9}$, $t_{k+10}$, $t_{k+11}$, $t_{k+12}$ are respectively $P_1(0)$, $X_3$, $X_4$, $P_1(3)$, $X_5$, $P_1(5)$, $P_1(6)$, $X_6$, $X_7$, $P_1(9)$, $X_8$, $P_1(11)$ and the sequential bits of the second bit stream in the corresponding time slots $t_{k+1}$, $t_{k+2}$, $t_{k+3}$, $t_{k+4}$, $t_{k+5}$, $T_{k+6}$, $t_{k+7}$, $t_{k+8}$, $t_{k+9}$, $t_{k+10}$, $t_{k+11}$, $t_{k+12}$ are respectively $P_2(0)$, $P_2(1)$, $P_2(2)$, $X_9$, $P_2(4)$, $X_{10}$, $P_2(6)$, $P_2(7)$, $P_2(8)$, $X_{11}$, $P_2(10)$, $X_{12}$ (where $X_3$–$X_{12}$ are dummy bits), and signalling that the bits in time slots $t_{k+2}$, $t_{k+3}$, $t_{k+5}$, $t_{k+8}$, $t_{k+9}$, $t_{k+11}$ of the first bit stream and that the bits in time slots $t_{k+4}$, $T_{k+6}$, $t_{k+10}$, $t_{k+12}$ of the second bit stream are dummy bits.

30. The method of claim 29 further including forming the first and second parallel sequential bit streams by coupling the sequential bits of the I and Q channels into a serial bit stream having sequential bits $P_1(0)$, $P_2(0)$, $P_2(1)$, $P_2(2)$, $P_1(3)$, $P_2(4)$, $P_1(5)$, $P_1(6)$, $P_2(6)$, $P_2(7)$, $P_2(8)$, $P_1(9)$, $P_2(10)$, $P_1(11)$.

31. Apparatus for encoding an intelligence signal into a convolutional encoded forward error correction signal comprising:

means for encoding input bits representing the intelligence signal into first and second parallel different sequential bit streams such that a plurality of the input bits is converted into multiple bits of each of the first and second parallel bit streams, the first and second parallel bit streams having corresponding sequential time slots 1, 2 ... $(j_1-1)$, $j_1$, $(j_1+1)$ ... $(j_2-1)$, $j_2$, $(j_2+1)$ ... $j_3$. ... M so there is in each time slot a bit of each bit stream;

means for combining and puncturing the third and fourth parallel bit streams into a serial punctured bit stream having time slots 1, 2 ... $(k_1-1)$, $k_1$, $(k_1+1)$, $(k_1+2)$ ... $(k_2-1)$, $k_2$, $(k_2+1)$ ... N, so that:

(a) for the time slot $j_1$ of the first and second bit streams, having no undeleted bits, (i) time slots $k_1$ and $(k_1+1)$ respectively have therein the bits in time slot $j_1$ of the first and second bit streams, (ii) time slot $(k_1-1)$ has a bit therein resulting from a bit in time slot $(j_1-1)$ of the first and second bit streams provided time slot $(j_1-1)$ of the first and second bit streams has at least one undeleted bit, and (iii) time slot $(k_1+2)$ has a bit therein resulting from a bit in time slot $(j_1+1)$ of the first and second bit streams provided time slot $(j_1+1)$ of the first and second bit streams has at least one undeleted bit of the first and second bit streams; (b) for the time slot $j_2$ of the first and second bit streams having one undeleted bit and one deleted bit, (i) time slot $k_2$ has the undeleted bit, (ii) time slot $(k_2-1)$ has a bit therein resulting from a bit in time slot $(j_2-1)$ of the first and second bit streams provided time slot $(j_2-1)$ of the first and second bit streams has at least one undeleted bit, time slot $(k_2+1)$ has a bit therein resulting from a bit in time slot $(j_{2+1})$ of the first and second bit streams provided time slot $(j_{2+1})$ of the first and second bit streams has at least one undeleted bit; and (c) for the time slot $j_3$ of the first and second bit streams having only deleted bits there is no time slot in the serial deleted bit stream, and means for converting the serial stream into a further pair of bit streams having corresponding time slots with bits having a bit rate different from the bit rate of the serial stream, the bits in the corresponding time slots of the further pair of bit streams being susceptible of having different values.

32. The apparatus of claim 31 further including means for modulating a wave in response to the further pair of bit streams, the modulating means being simultaneously responsive to the further pair of bit streams.

33. The apparatus of claim 31 wherein the means for subjecting and the means for combining include:
means for merging the bits of the first and second parallel bit streams into a first convolutional encoded serial bit stream having a first bit rate,
a first in first out register responsive to the first convolutional encoded serial bit stream for deriving a second convolution encoded serial bit stream having a second bit rate, and
clock means for controlling the rates at which the first and second serial bit streams are applied to and derived from the register, the clock means including a puncturing bit memory for controlling clocking of one of said bit streams in the register, the puncturing bit memory being coupled to the first in first out register to control puncturing of the first serial bit stream so that the second serial bit stream does not include the punctured bits.

34. In a method of transmitting a forward error correction convolutional encoded signal having a first convolutional encoded bit stream of sequential bits $P_1(0)$, $P_1(1)$, $P_1(2)$, $P_1(3)$, $P_1(4)$ and a second convolutional encoded bit stream of sequential bits $P_2(0)$, $P_2(1)$, $P_2(2)$, $P_2(3)$, $P_2(4)$, comprising the steps of puncturing only every other bit of the first bit stream to derive a punctured first bit stream and responding to the punctured first bit stream and the second bit stream to derive parallel I and Q channels wherein four sequential time slots $t_k$, $t_{k+1}$, $t_{k+2}$, $t_{k+3}$ of the I channel respectively consist of bits $P_1(0)$, $P_2(1)$, $P_2(2)$, $P_1(4)$ and the corresponding time slots $t_k$, $t_{k+1}$, $t_{k+2}$, $t_{k+3}$ of the Q channel respectively consist of bits $P_2(0)$, $P_1(2)$, $P_2(3)$, $P_2(4)$, and simultaneously modulating a carrier with the two bits of the I and Q channels in time slots $t_k$, $t_{k+1}$, $t_{k+2}$, $t_{k+3}$.

35. The method of claim 34 further including combining the first and second bit streams into a serial bit stream having sequential bits $P_1(0)$, $P_2(0)$, $P_2(1)$, $P_1(2)$, $P_2(2)$, $P_2(3)$, $P_1(4)$, $P_2(4)$ in the stated order to derive the I and Q channels.

36. In a method of transmitting a forward error correction convolutional encoded signal having a first convolutional encoded bit stream of sequential bits $P_1(0)$, $P_1(1)$, $P_1(2)$, $P_1(3)$, $P_1(4)$, $P_1(5)$, $P_1(6)$, $P_1(7)$, $P_1(8)$, $P_1(9)$, $P_1(10)$, $P_1(11)$ and a second convolutional encoded bit stream of sequential bits $P_2(0)$, $P_2(1)$, $P_2(2)$, $P_2(3)$, $P_2(4)$, $P_2(5)$, $P_2(6)$, $P_2(7)$, $P_2(S)$, $P_2(9)$, $P_2(10)$, $P_2(11)$, comprising the steps of puncturing every sequence of six bits of the first convolutional encoded bit stream so only the bits in second, third and fifth time slots of the sequence are punctured to derive a punctured first bit stream, puncturing every sequence of six bits of the second convolutional encoded bit stream so only the bits in fourth and sixth time slots of the sequence are punctured to derive a punctured second bit stream, the sequences of the first and second convolutional encoded bit streams having corresponding first through sixth time slots, and responding to the punctured first and second bit streams to derive parallel I and Q channels wherein seven sequential time slots $t_k$, $t_{k+1}$, $t_{k+2}$, $t_{k+3}$, $t_{k+4}$, $t_{k+5}$, $t_{k+6}$ of the I channel respectively consist of bits $P_1(0)$, $P_2(1)$, $P_1(3)$, $P_1(5)$, $P_2(6)$, $P_2(8)$, $P_2(10)$ and the corresponding time slots $t_k$, $t_{k+1}$, $t_{k+2}$, $t_{k+3}$, $t_{k+4}$, $t_{k+5}$, $t_{k+6}$ of the Q channel respectively consist of bits $P_2(0)$, $P_2(2)$, $P_2(4)$, $P_1(6)$, $P_2(7)$, $P_1(9)$, $P_1(11)$, and simultaneously modulating a carrier with the two bits of the I and Q channels in time slots $t_k$, $t_{k+1}$, $t_{k+2}$, $t_{k+3}$, $t_{k+4}$, $t_{k+5}$, $T_{k+6}$.

37. The method of claim 36 further including combining the first and second convolutional encoded bit streams into a serial bit stream having sequential bits $P_1(0)$, $P_2(0)$, $P_2(1)$, $P_2(2)$, $P_1(3)$, $P_2(4)$, $P_1(5)$, $P_1(6)$, $P_2(6)$, $P_2(7)$, $P_2(8)$, $P\,1(9)$, $P_2(10)$, $P\,1(11)$ to derive the I and Q channels.

38. A receiver responsive to a plural channel (I and Q) convolutional encoded data signal punctured at a predetermined rate comprising means responsive to the plural channels of the signal for deriving a serial signal having sequential bits so sequential bits $I(0)$, $I(1)$, $I(2)$ etc. of time slots $t_k$, $t_{k+1}$, $t_{k+2}$, of channel I and sequential bits $Q(0)$, $Q(1)$, $Q(2)$ etc. of channel Q at the same time slots $t_k$, $t_{k+1}$, $t_{k+2}$ are sequentially derived in the serial signal as $I(0)$, $Q(0)$, $I(1)$, $Q(1)$, $I(2)$, $Q(2)$ etc., means for deriving a punctured clock synchronized with the sequential bits of the serial signal, means for (a) combining the punctured clock synchronized with the sequential bits of the serial signal and the sequential bits of the serial signal and (b) deriving a pair of output wavetrains $G_1$ and $G_2$ including the sequential bits of the I and Q channels and dummy bits inserted into the serial signal by the means for combining, bit train $G_1$ including bits of the I and Q channels, bit train $G_2$ including bits of the I and Q channels, and means for indicating which of the bits in bit trains $G_1$ and $G_2$ are dummy bits.

39. The receiver of claim 38 wherein wavetrains $G_1$ and $G_2$ are derived by: alternately supplying consecutive bits $b_j$, $b_{j+1}$ of the serial signal to wavetrain $G_1$ and then to wavetrain $G_2$ unless the punctured clock signifies a dummy bit is to be inserted immediately before serial bit $b_i$; if the punctured clock signifies a dummy bit is to be inserted immediately before serial bit $b_i$ (a) inserting a dummy bit in a selected $G_1$ or $G_2$ wavetrain immediately before bit $b_i$ and (b) inserting bit $b_i$ in the nonselected $G_1$ or $G_2$ wavetrain unless the punctured clock signifies a dummy bit is to be inserted.

40. A receiver responsive to a received plural channel (I and Q) forward error correction convolutional encoded data signal punctured at a predetermined rate, the data signal being received from a transmitter wherein first and second ½ rate encoded data wavetrains are derived and the ½ rate convolutional encoded data wavetrains are converted into punctured I and Q channels that are approximately the same as the received forward error correction convolutional encoded data signal, the I channel at the transmitter including sequential bits of the first and second wavetrains in different time slots, the Q channel at the transmitter including sequential bits of the first and second wavetrains in different time slots, the receiver comprising means responsive to the plural channels of the signal at the receiver for deriving a serial signal having sequential bits so sequential bits $I(0)$, $I(1)$, $I(2)$ etc. of time slots $t_k$, $t_{k+1}$, $t_{k+2}$, of received channel I and sequential bits $Q(0)$, $Q(1)$, $Q(2)$ etc. of received channel Q at the same time slots $t_k$, $t_{k+1}$, $t_{k+2}$ are sequentially derived in the serial signal as $I(0)$, $Q(0)$, $I(1)$, $Q(1)$, $I(2)$, $Q(2)$ etc., means for deriving a punctured clock synchronized with the sequential bits of the serial signal, means for (a) combining the punctured clock synchronized with the sequential bits of the serial signal and the sequential bits of the serial signal and (b) deriving a pair of output wavetrains $G_1$ and $G_2$ including the sequential bits of the received I and Q channels and dummy bits inserted into the serial signal by the means for combining, wavetrain $G_1$ including only bits of the first wavetrain and dummy bits, wavetrain $G_2$ including only bits of the second wavetrain and dummy bits, and means for indicating which of the bits in wavetrains $G_1$ and $G_2$ are dummy bits.

41. The receiver of claim 40 further including a decoder responsive to bit trains $G_1$ and $G_2$ for deriving a sequence of data bits similar to the sequential data bits that are encoded into the first and second ½ rate convolutional encoded data wavetrains.

42. The receiver of claim 40 wherein the bits of the I and Q channels are received at a symbol rate, and the means for deriving the serial signal includes a multiplexer having first and second inputs respectively responsive to the received I and Q channels and an output terminal and a clock source for activating the multiplexer so the I channel and the Q channel are coupled to the output terminal once at different times during a single symbol time of the received I and Q channels.

43. The receiver of claim 42 wherein the means for deriving the pair of output wavetrains includes circuitry clocked by the punctured clock and responsive to the serial signal for deriving bit trains $G_1$ and $G_2$ at the frequency of the first and second ½ rate convolutional encoded data wavetrains.

44. The receiver of claim 43 wherein the clocked circuitry includes a first in/first out register having signal input and output terminals and clock input and clock output terminals, the signal input terminal being responsive to the multiplexer output and the clock input terminal being responsive to a clock having a frequency causing clocking of every bit at the multiplexer output terminal into the register, a serial to parallel converter having an input responsive to the register output and having a pair of output terminals on which the $G_1$ and $G_2$ bit trains are derived, the register clock output terminal being responsive to the punctured clock.

45. A receiver responsive to a received plural channel (I and Q) forward error correction convolutional encoded data signal punctured at a predetermined rate, the data signal being received from a transmitter wherein first and second encoded data wavetrains are derived and the convolutional encoded data wavetrains are converted into punctured I and Q channels that are approximately the same as the received forward error correction convolutional encoded data signal, the I channel at the transmitter including sequential bits of the first and second wavetrains in different time slots, the Q channel at the transmitter including sequential bits of the first and second wavetrains in different time slots, the receiver comprising means, including analog to digital converter means, responsive to the received plural channel signal for deriving parallel I and Q channel digital signals containing the information in the I and Q channels of the received signal, means responsive to the parallel I and Q channel digital signals for deriving a serial digital signal containing bits of the parallel I and Q channel digital signals, and means for converting the serial digital signal into a pair of output wavetrains $G_1$, $G_2$, each of wavetrains $G_1$, $G_2$ including (a) sequential bits of the received I and Q channels and (b) dummy bits inserted into the serial digital signal, wavetrain $G_1$ including only bits of the first wavetrain and dummy bits, wavetrain $G_2$ including only bits of the second wavetrain and dummy bits, and means for indicating which of the bits in wavetrains $G_1$ and $G_2$ are dummy bits.

46. The receiver of claim 45 wherein the means for converting the serial digital signal into a pair of output wavetrains $G_1$ and $G_2$ includes means for deriving a punctured clock synchronized with the sequential bits of the serial signal, the punctured clock being combined with sequential bits of the serial digital signal to derive the output wavetrains $G_1$ and $G_2$.

47. In a forward correction method of transmitting an intelligence signal, the steps of:

encoding input bits representing the intelligence signal into first and second parallel different sequential bit streams such that a plurality of the input bits is converted into multiple bits of each of the first and second parallel bit streams, combining and puncturing the first and second parallel bit streams into a serial punctured bit stream including only some of the bits of the first and second parallel bit streams so that the serial punctured bit stream includes the bit sequence $b_1 \ldots b_{i-1}, b_i, b_{i+1} \ldots b_j, b_{j+1} \ldots b_k, b_{k+1} \ldots b_N$, wherein j is any of $1 \ldots i \ldots N$, and none of $b_{i-1}$, $b_i$ or $b_{i+1}$ is a punctured bit and $b_{i-1}$ and $b_{i+1}$ are consecutive bits from the first parallel bit stream and $b_i$ is a bit from the second parallel bit stream, and $b_k$ and $b_{k+1}$ are consecutive bits from the first parallel bit stream as a result of puncturing in the second parallel channel, converting the serial bit stream into two parallel I and Q bit channels such that bits $b_{i-1}$ and $b_{i+1}$ of the serial bit stream are always in the I channel and bit $b_i$ of the serial bit stream is always in the Q channel, bits $b_j$, $b_{j+1}$ of the serial bit stream are simultaneously derived in the I and Q channels, and bits $b_k$ and $b_{k+1}$ are respectively in the I and Q channels, and simultaneously modulating a wave with consecutive bits of the I and Q channels.

* * * * *